United States Patent
Pasdast et al.

(10) Patent No.: US 12,519,084 B2
(45) Date of Patent: Jan. 6, 2026

(54) FORWARDED SUPPLY VOLTAGE FOR DYNAMIC VOLTAGE AND FREQUENCY SCALING WITH STACKED CHIP PACKAGING ARCHITECTURE

(71) Applicant: Intel Corporation, Santa Clara, CA (US)

(72) Inventors: Gerald S. Pasdast, San Jose, CA (US); Peipei Wang, San Jose, CA (US); Adel A. Elsherbini, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 830 days.

(21) Appl. No.: 17/588,392

(22) Filed: Jan. 31, 2022

(65) Prior Publication Data

US 2023/0245999 A1    Aug. 3, 2023

(51) Int. Cl.
| | | |
|---|---|---|
| H01L 23/538 | (2006.01) | |
| H01L 25/065 | (2023.01) | |
| H04B 3/02 | (2006.01) | |

(52) U.S. Cl.
CPC ...... *H01L 25/0652* (2013.01); *H01L 23/5383* (2013.01); *H01L 23/5386* (2013.01); *H01L 25/0655* (2013.01); *H01L 25/0657* (2013.01); *H04B 3/02* (2013.01)

(58) Field of Classification Search
None
See application file for complete search history.

(56) References Cited

U.S. PATENT DOCUMENTS

| | | | | |
|---|---|---|---|---|
| 2017/0287872 | A1* | 10/2017 | Shen | H01L 23/367 |
| 2019/0131976 | A1* | 5/2019 | Chandrasekar | H01L 23/5385 |
| 2019/0333550 | A1* | 10/2019 | Fisch | H10B 12/50 |
| 2021/0111153 | A1* | 4/2021 | Lin | H01L 24/08 |
| 2021/0225708 | A1* | 7/2021 | Lee | H01L 25/18 |
| 2021/0311517 | A1* | 10/2021 | Srinivasan | G05F 1/575 |
| 2021/0311537 | A1* | 10/2021 | Srinivasan | H01L 25/18 |
| 2022/0199537 | A1* | 6/2022 | Qian | H01L 25/0657 |
| 2023/0420416 | A1* | 12/2023 | Lee | H01L 25/0652 |

FOREIGN PATENT DOCUMENTS

WO    2017164810    9/2017

* cited by examiner

*Primary Examiner* — Nicholas J Tobergte
*Assistant Examiner* — William Henry Anderson
(74) *Attorney, Agent, or Firm* — Akona IP PC

(57) ABSTRACT

Embodiments of the present disclosure provide a microelectronic assembly comprising: a first integrated circuit (IC) die in a first layer; an interposer in a second layer not coplanar with the first layer, the first layer coupled to the second layer by interconnects having a pitch of less than 10 micrometers between adjacent interconnects; and a first conductive pathway and a second conductive pathway in the interposer coupling the first IC die and a second IC die. The first IC die is configured to transmit at a first supply voltage through the first conductive pathway to a second IC die, the second IC die is configured to transmit to the first IC die through the second conductive pathway at a second supply voltage simultaneously with the first die transmitting at the first supply voltage, and the first supply voltage is different from the second supply voltage.

20 Claims, 9 Drawing Sheets

FORWARDED SUPPLY VOLTAGE FOR DYNAMIC VOLTAGE AND FREQUENCY SCALING WITH STACKED CHIP PACKAGING ARCHITECTURE

TECHNICAL FIELD

The present disclosure relates to techniques, methods, and apparatus directed to forwarded supply voltage for dynamic voltage and frequency scaling (DVFS) with stacked chip packaging architecture.

BACKGROUND

Electronic circuits when commonly fabricated on a wafer of semiconductor material, such as silicon, are called integrated circuits (ICs). The wafer with such ICs is typically cut into numerous individual dies. The dies may be packaged into an IC package containing one or more dies along with other electronic components such as resistors, capacitors, and inductors. The IC package may be integrated onto an electronic system, such as a consumer electronic system, or servers, such as mainframes.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Overview

Figure 1A:
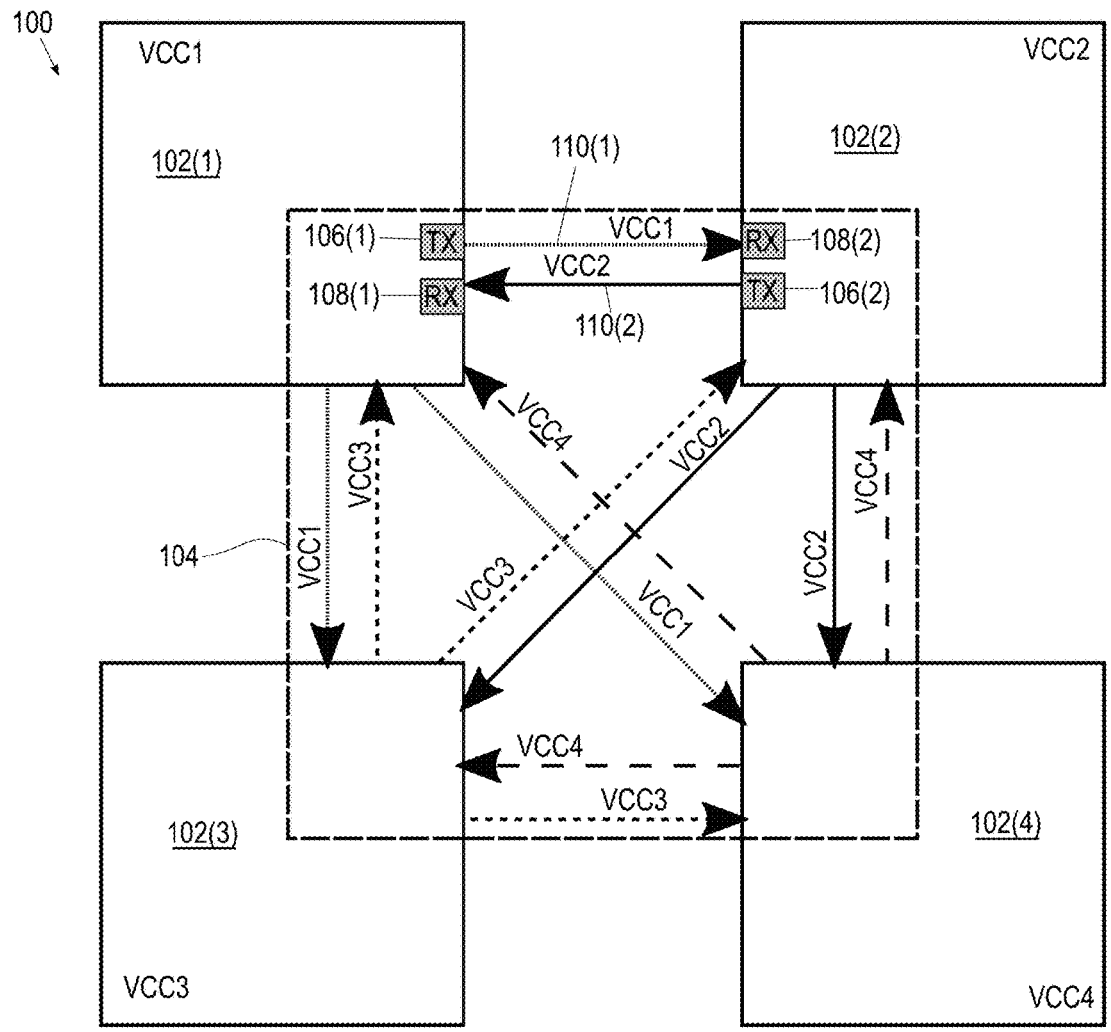
FIG. 1A is a simplified top view of an example microelectronic assembly according to some embodiments of the present disclosure.

For purposes of illustrating IC packages described herein, it is important to understand phenomena that may come into play during assembly and packaging of ICs. The following foundational information may be viewed as a basis from which the present disclosure may be properly explained. Such information is offered for purposes of explanation only and, accordingly, should not be construed in any way to limit the broad scope of the present disclosure and its potential applications.

Power dissipation (P) of an IC in a semiconductor die (IC die) is dependent on capacitance (C), clock frequency (f) and supply voltage (V), with $P=CfV^2$. The upper limit of the clock frequency is determined by supply voltage, thus a reduction in the supply voltage results in corresponding reduction in power dissipation. However, the reduction in the supply voltage of the IC die results in an increase in delay through the IC die which results in slowing down the execution time of an application using the IC die. Thus, when the execution time of the application is not critical or not required, for example, in an inactive application state, or during frequency-insensitive application phases, the clock frequency or supply voltage of the IC die may be reduced in order to reduce the energy consumption of the system. To this end, the IC die may support multiple power states and provide a software interface for handling a request to change to a lower or higher power state. DVFS is one technique that is typically used to provide power optimization during run-time. In typical systems, DVFS may be performed in hardware, in an operating system (OS), or in a user-level application. The hardware-level DVFS monitors application load and scales the IC die's supply voltage without involvement of software or OS. The OS-level DVFS uses heuristic scheduling based on a fixed time interval or scheduled tasks to perform DVFS. User-level DVFS enables a user application to profile IC die utilization during execution and scale the IC die's supply voltage or clock frequency up or down.

Typically, a particular IC die follows a characteristic frequency to supply voltage function ("FV curve") depending on the process it underwent during manufacture. Thus, the IC die may have a different FV curve compared to another IC die having the same design because of process variations between the IC dies. Process variation results in changes in transistor parameters beyond their nominal values due to imprecise manufacturing. These variations can affect operating frequency (e.g., switching speed). For example, due to variations in the equipment, operators, position on a wafer, etc., a specific parameter may vary between IC dies built on the same wafer, IC dies built on different wafers in the same lot and/or on IC dies built on different wafers in different lots. If this parameter is, for example, channel length, width or threshold voltages, the transistors of each IC die may be different such that the performance varies (e.g., faster or slower).

Further, advances in semiconductor processing and logic design are trending toward disaggregating circuits on planar monolithic IC dies into smaller IC dies (e.g., chiplets, tiles) electrically coupled by interconnect bridges. The smaller IC dies are part of an assembly of interconnected IC dies that together form a complete IC in terms of application and/or functionality, such as a memory chip, microprocessor, microcontroller, commodity IC (e.g., chip used for repetitive processing routines, simple tasks, application specific IC, etc.), and system-on-a-chip (SOC). In other words, the individual IC dies are connected together to create the functionalities of a monolithic IC. By using separate IC dies, each individual IC die can be designed and manufactured optimally for a particular functionality. For example, a processor core that contains logic circuits might aim for performance, and thus might require a very speed-optimized layout. This has different manufacturing requirements compared to a Universal Serial Bus (USB) controller, which is built to meet certain USB standards, rather than for processing speed. Thus, by having different parts of the overall design separated into different IC dies, each one optimized in terms of design and manufacturing, the overall yield and cost of the combined die solution may be improved.

The connectivity between these IC dies is achievable by many different ways. For example, in 2.5D packaging solutions, a silicon interposer and through-substrate vias (TSVs), also called through-silicon vias where the substrate is silicon, connect dies at silicon-interconnect speed in a minimal footprint. In another example, interconnect bridges (e.g., Embedded Multi-Die Interconnect Bridge (EMIB™)), embedded under the edges of two interconnecting dies facilitates electrical coupling between them. In a three-dimensional (3D) architecture, the dies are stacked one above the other, creating a smaller footprint overall. Typically, the electrical connectivity and mechanical coupling in such 3D architecture is achieved using TSVs and high-pitch solder-based bumps (e.g., C2 interconnections). The EMIB and the 3D stacked architecture may also be combined using an omni-directional interconnect (ODI), in which EMIB chips are embedded in an organic mold compound, which allows for top-packaged chips to communicate with other chips horizontally using EMIB and vertically, using through-mold vias (TMVs) which are typically larger than TSVs. Some of these current interconnect technologies use solder or its equivalent for connectivity, with consequent low vertical and horizontal interconnect density. For example, typical flip-chip solder bumps have a pitch of 112-150 micrometers, and a hundred of such bumps having a pitch of 112 micrometers will occupy an area of approximately 1.21 square millimeters.

In this regard, a quasi-monolithic hierarchical integration architecture using recursively coupled plurality of IC dies to form microelectronic assemblies helps to mitigate several drawbacks mentioned above. The plurality of IC dies may comprise active dies and/or passive dies, and at least a portion in the plurality of IC dies are coupled using die-to-die (DTD) interconnects with sub-10 micrometer pitch, also referred to as "hybrid bonds," "hybrid interconnects," or "direct bond interconnects." In other words, the center-to-center separation between adjacent high-density interconnects is less than or equal to 10 micrometers. In such quasi-monolithic structures, IC dies are stacked in multiple layers with inorganic dielectric between the layers and around the IC dies. By using hybrid bonds or equivalent, having a pitch of less than 10 micrometers, an effective interconnection area may be reduced considerably from a corresponding interconnection area having the same number of flip-chip interconnects. For example, with 9 micrometer pitch, 100 hybrid bonds will occupy an effective area of approximately 0.0081 square millimeters, which is several orders of magnitude smaller than (e.g., 151.25× shrink factor) with flip-chip interconnects having a pitch of 112 micrometers. Electrical coupling through the dielectric is implemented with through-dielectric vias (TDVs) that are pass-through structures, i.e., they provide an electrical pathway between layers without any intermediate circuitry.

However, typical DVFS techniques, whether in hardware or software, focus on the operation of a single IC die, without considering the characteristic frequency to voltage supply function of any other IC dies with which it communicates. As a result, such DVFS techniques may be inefficient in a multi-chip assembly comprising many IC dies in synchronous communication with each other as described above for the quasi-monolithic hierarchical integration architecture. In such inefficient DVFS techniques, all IC dies in synchronous communication need to operate at the same DVFS point at any given time without the ability to, for example, operate at one frequency/voltage (FV) point for outbound data while inbound data operates at a different and independent FV point. Since the individual IC dies can be from different process nodes and also vary in skew within a process node, forcing a pair or more IC dies to synchronously operate at the same DVFS point forces sub-optimal power optimization.

Embodiments of the present disclosure provide a microelectronic assembly comprising: a first IC die in a first layer; an interposer in a second layer not coplanar with the first layer, the first layer coupled to the second layer by interconnects having a pitch of less than 10 micrometers between adjacent interconnects; and a first conductive pathway and a second conductive pathway in the interposer coupling the first IC die and a second IC die. The first IC die is configured to transmit at a first supply voltage (VCC1) through the first conductive pathway to a second IC die, the second IC die is configured to transmit to the first IC die through the second conductive pathway at a second supply voltage (VCC2) simultaneously with the first die transmitting at the first supply voltage, and the first supply voltage is different from the second supply voltage.

This forwarded VCC architecture may allow IC die-independent DVFS operating points across multiple IC dies. Forwarded supply voltage allows for optimized FV curves across process nodes as signals/datapath cross IC die boundaries versus a more complex first-in-first-out (FIFO) scheme. By forwarding VCC, the FV curves can also be optimized for each chiplet for process node optimization (as well as die skew optimization/binning). IC dies from different process nodes as well as die speed skew will have a natural optimized FV curve. As ICs are disaggregated into finer granularity chiplets, enabled by hybrid bonding and tiny bump pitches (e.g., less than 10 micrometer pitch), such a scheme may allow for binning, FV curve optimization, and DVFS independent operation at the same granularity as the number of chiplets that comprise the SOC.

Each of the structures, assemblies, packages, methods, devices, and systems of the present disclosure may have several innovative aspects, no single one of which is solely responsible for all the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art.

The terms "circuit" and "circuitry" mean one or more passive and/or active electrical and/or electronic components that are arranged to cooperate with one another to provide a desired function. The terms also refer to analog circuitry, digital circuitry, hard wired circuitry, programmable circuitry, microcontroller circuitry and/or any other type of physical hardware electrical and/or electronic component.

The term "integrated circuit" means a circuit that is integrated into a monolithic semiconductor or analogous material.

In some embodiments, the IC dies disclosed herein may comprise substantially monocrystalline semiconductors, such as silicon or germanium, as a base material (e.g., substrate, body) on which integrated circuits are fabricated with traditional semiconductor processing methods. The semiconductor base material may include, for example, N-type pr P-type materials. Dies may include, for example, a crystalline base material formed using a bulk silicon (or other bulk semiconductor material) or a semiconductor-on-insulator (SOI, e.g., a silicon-on-insulator) structure. In some other embodiments, the base material of one or more of the IC dies may comprise alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-N, group III-V, group II-VI, or group IV materials. In yet other embodiments, the base material may comprise compound semiconductors, for example, with a first sub-lattice of at least one element from group III of the periodic table (e.g., Al, Ga, In), and a second sub-lattice of at least one element of group V of the periodic table (e.g., P, As, Sb). In yet other embodiments, the base material may comprise an intrinsic IV or III-V semiconductor material or alloy, not intentionally doped with any electrically active impurity; in alternate embodiments, nominal impurity dopant levels may be present. In still other embodiments, dies may comprise a non-crystalline material, such as polymers; for example, the base material may comprise silica-filled epoxy. In other embodiments, the base material may comprise high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the base material may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphide, and black phosphorus, each of which may possibly be doped with one or more of gallium, indium, aluminum, fluorine, boron, phosphorus, arsenic, nitrogen, tantalum, tungsten, and magnesium, etc. Although a few examples of the material for dies are described here, any material or structure that may serve as a foundation (e.g., base material) upon which IC circuits and structures as described herein may be built falls within the spirit and scope of the present disclosure.

Unless described otherwise, IC dies described herein include one or more IC structures (or, simply, "ICs") implementing (i.e., configured to perform) certain functionality. In one such example, the term "memory die" may be used to describe a die that includes one or more ICs implementing memory circuitry (e.g., ICs implementing one or more of memory devices, memory arrays, control logic configured to control the memory devices and arrays, etc.). In another such example, the term "compute die" may be used to describe a die that includes one or more ICs implementing logic/compute circuitry (e.g., ICs implementing one or more of I/O functions, arithmetic operations, pipelining of data, etc.).

In another example, the terms "package" and "IC package" are synonymous, as are the terms "die" and "IC die." Note that the terms "chip," "die," and "IC die" are used interchangeably herein.

The term "insulating" means "electrically insulating," the term "conducting" means "electrically conducting," unless otherwise specified. With reference to optical signals and/or devices, components and elements that operate on or using optical signals, the term "conducting" can also mean "optically conducting."

The terms "oxide," "carbide," "nitride," etc. refer to compounds containing, respectively, oxygen, carbon, nitrogen, etc.

The term "high-k dielectric" refers to a material having a higher dielectric constant than silicon oxide, while the term "low-k dielectric" refers to a material having a lower dielectric constant than silicon oxide.

The term "insulating material" or "insulator" (also called herein as "dielectric material" or "dielectric") refers to solid materials (and/or liquid materials that solidify after processing as described herein) that are substantially electrically nonconducting. They may include, as examples and not as limitations, organic polymers and plastics, and inorganic materials such as ionic crystals, porcelain, glass, silicon, silicon oxide, silicon carbide, silicon carbonitride, silicon nitride, and alumina or a combination thereof. They may include dielectric materials, high polarizability materials, and/or piezoelectric materials. They may be transparent or opaque without departing from the scope of the present disclosure. Further examples of insulating materials are underfills and molds or mold-like materials used in packaging applications, including for example, materials used in organic interposers, package supports and other such components.

In various embodiments, elements associated with an IC may include, for example, transistors, diodes, power sources, resistors, capacitors, inductors, sensors, transceivers, receivers, antennas, etc. In various embodiments, elements associated with an IC may include those that are monolithically integrated within an IC, mounted on an IC, or those connected to an IC. The ICs described herein may be either analog or digital and may be used in a number of applications, such as microprocessors, optoelectronics, logic blocks, audio amplifiers, etc., depending on the components associated with the IC. The ICs described herein may be employed in a single IC die or as part of a chipset for executing one or more related functions in a computer.

In various embodiments of the present disclosure, transistors described herein may be field effect transistors (FETs), e.g., metal-oxide semiconductor field effect transistors (MOSFETs). In general, a FET is a three-terminal device that includes source, drain, and gate terminals and uses electric field to control current flowing through the device. A FET typically includes a channel material, a source region and a drain regions provided in and/or over the channel material, and a gate stack that includes a gate electrode material, alternatively referred to as a "work function" material, provided over a portion of the channel material (the "channel portion") between the source and the drain regions, and optionally, also includes a gate dielectric material between the gate electrode material and the channel material.

In a general sense, an "interconnect" refers to any element that provides a physical connection between two other elements. For example, an electrical interconnect provides electrical connectivity between two electrical components, facilitating communication of electrical signals between them; an optical interconnect provides optical connectivity between two optical components, facilitating communication of optical signals between them. As used herein, both electrical interconnects and optical interconnects are comprised in the term "interconnect." The nature of the interconnect being described is to be understood herein with reference to the signal medium associated therewith. Thus, when used with reference to an electronic device, such as an IC that operates using electrical signals, the term "interconnect" describes any element formed of an electrically conductive material for providing electrical connectivity to one or more elements associated with the IC or/and between various such elements. In such cases, the term "interconnect" may refer to both conductive traces (also sometimes referred to as "lines," "wires," "metal lines" or "trenches") and conductive vias (also sometimes referred to as "vias" or "metal vias"). Sometimes, electrically conductive traces and vias may be referred to as "conductive traces" and "conductive vias", respectively, to highlight the fact that these elements include electrically conductive materials such as metals. Likewise, when used with reference to a device that operates on optical signals as well, such as a photonic IC (PIC), "interconnect" may also describe any element formed of a material that is optically conductive for providing optical connectivity to one or more elements associated with the PCI. In such cases, the term "interconnect" may refer to optical waveguides (e.g., structures that guide and confine light waves), including optical fiber, optical splitters, optical combiners, optical couplers, and optical vias.

The term "conductive trace" may be used to describe an electrically conductive element isolated by an insulating material. Within IC dies, such insulating material comprises interlayer low-k dielectric that is provided within the IC die. Within package substrates, and printed circuit boards (PCBs) such insulating material comprises organic materials such as Ajinomoto Buildup Film (ABF), polyimides, or epoxy resin. Such conductive lines are typically arranged in several levels, or several layers, of metallization stacks.

The term "conductive via" may be used to describe an electrically conductive element that interconnects two or more conductive lines of different levels of a metallization stack. To that end, a via may be provided substantially perpendicularly to the plane of an IC die/chip or a support structure over which an IC structure is provided and may interconnect two conductive lines in adjacent levels or two conductive lines in non-adjacent levels.

The term "metallization stack" may be used to refer to a stack of one or more interconnects for providing connectivity to different circuit components of an IC die/chip and/or a package substrate.

As used herein, the term "pitch" of interconnects refers to a center-to-center distance between adjacent interconnects.

In context of a stack of dies coupled to one another or in context of a die coupled to a package substrate, the term "interconnect" may also refer to, respectively, DTD interconnects and die-to-package substrate (DTPS) interconnects.

Although not specifically shown in all of the present illustrations in order to not clutter the drawings, when DTD or DTPS interconnects are described, a surface of a first die may include a first set of conductive contacts, and a surface of a second die or a package substrate may include a second set of conductive contacts. One or more conductive contacts of the first set may then be electrically and mechanically coupled to some of the conductive contacts of the second set by the DTD or DTPS interconnects.

In some embodiments, the pitch of the DTD interconnects may be different from the pitch of the DTPS interconnects, although, in other embodiments, these pitches may be substantially the same.

The DTPS interconnects disclosed herein may take any suitable form. In some embodiments, a set of DTPS interconnects may include solder (e.g., solder bumps or balls that are subject to a thermal reflow to form the DTPS interconnects). DTPS interconnects that include solder may include any appropriate solder material, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, a set of DTPS interconnects may include an anisotropic conductive material, such as an anisotropic conductive film or an anisotropic conductive paste. An anisotropic conductive material may include conductive materials dispersed in a non-conductive material. In some embodiments, an anisotropic conductive material may include microscopic conductive particles embedded in a binder or a thermoset adhesive film (e.g., a thermoset biphenyl-type epoxy resin, or an acrylic-based material). In some embodiments, the conductive particles may include a polymer and/or one or more metals (e.g., nickel or gold). For example, the conductive particles may include nickel-coated gold or silver-coated copper that is in turn coated with a polymer. In another example, the conductive particles may include nickel. When an anisotropic conductive material is uncompressed, there may be no conductive pathway from one side of the material to the other. However, when the anisotropic conductive material is adequately compressed (e.g., by conductive contacts on either side of the anisotropic conductive material), the conductive materials near the region of compression may contact each other so as to form a conductive pathway from one side of the film to the other in the region of compression.

The DTD interconnects disclosed herein may take any suitable form. In some embodiments, some or all of the DTD interconnects in a microelectronic assembly or an IC package as described herein may be metal-to-metal interconnects (e.g., copper-to-copper interconnects, or plated interconnects). In such embodiments, the conductive contacts on either side of the DTD interconnect may be bonded together (e.g., under elevated pressure and/or temperature) without the use of intervening solder or an anisotropic conductive material. In some metal-to-metal interconnects, a dielectric material (e.g., silicon oxide, silicon nitride, silicon carbide) may be present between the metals bonded together (e.g., between copper pads or posts that provide the associated conductive contacts). In some embodiments, one side of a DTD interconnect may include a metal pillar (e.g., a copper pillar), and the other side of the DTD interconnect may include a metal contact (e.g., a copper contact) recessed in a dielectric. In some embodiments, a metal-to-metal interconnect (e.g., a copper-to-copper interconnect) may include a noble metal (e.g., gold) or a metal whose oxides are conductive (e.g., silver). In some embodiments, a metal-to-metal interconnect may include metal nanostructures (e.g., nanorods) that may have a reduced melting point. Metal-to-metal interconnects may be capable of reliably conducting a higher current than other types of interconnects; for example, some solder interconnects may form brittle intermetallic compounds when current flows, and the maximum current provided through such interconnects may be constrained to mitigate mechanical failure.

In some embodiments, the dies on either side of a set of DTD interconnects may be unpackaged dies.

In some embodiments, the DTD interconnects may include solder. For example, the DTD interconnects may include conductive bumps or pillars (e.g., copper bumps or pillars) attached to the respective conductive contacts by solder. In some embodiments, a thin cap of solder may be used in a metal-to-metal interconnect to accommodate planarity, and this solder may become an intermetallic compound during processing. In some embodiments, the solder used in some or all of the DTD interconnects may have a higher melting point than the solder included in some or all of the DTPS interconnects. For example, when the DTD interconnects in an IC package are formed before the DTPS interconnects are formed, solder-based DTD interconnects may use a higher-temperature solder (e.g., with a melting point above 200 degrees Celsius), while the DTPS interconnects may use a lower-temperature solder (e.g., with a melting point below 200 degrees Celsius). In some embodiments, a higher-temperature solder may include tin; tin and gold; or tin, silver, and copper (e.g., 96.5% tin, 3% silver, and 0.5% copper). In some embodiments, a lower-temperature solder may include tin and bismuth (e.g., eutectic tin bismuth), tin, silver, bismuth, indium, indium and tin, or gallium.

In some embodiments, a set of DTD interconnects may include an anisotropic conductive material, such as any of the materials discussed above for the DTPS interconnects. In some embodiments, the DTD interconnects may be used as data transfer lanes, while the DTPS interconnects may be used for power and ground lines, among others.

In microelectronic assemblies or IC packages as described herein, some or all of the DTD interconnects may have a finer pitch than the DTPS interconnects. In some embodiments, the DTPS interconnects disclosed herein may have a pitch between about 80 microns and 300 microns, while the DTD interconnects disclosed herein may have a pitch between about 0.5 microns and 100 microns, depending on the type of the DTD interconnects. An example of silicon-level interconnect density is provided by the density of some DTD interconnects. In some embodiments, the DTD interconnects may have too fine a pitch to couple to the package substrate directly (e.g., too fine to serve as DTPS interconnects). The DTD interconnects may have a smaller pitch than the DTPS interconnects due to the greater similarity of materials in the different dies on either side of a set of DTD interconnects than between a die and a package substrate on either side of a set of DTPS interconnects. In particular, the differences in the material composition of dies and package substrates may result in differential expansion and contraction of the die dies and package substrates due to heat generated during operation (as well as the heat applied during various manufacturing operations). To mitigate damage caused by this differential expansion and contraction (e.g., cracking, solder bridging, etc.), the DTPS interconnects in any of the microelectronic assemblies or IC packages as described herein may be formed larger and farther apart than DTD interconnects, which may experience less thermal stress due to the greater material similarity of the pair of dies on either side of the DTD interconnects.

It will be recognized that one more levels of underfill (e.g., organic polymer material such as benzotriazole, imidazole, polyimide, or epoxy) may be provided in an IC package described herein and may not be labeled in order to avoid cluttering the drawings. In various embodiments, the levels of underfill may comprise the same or different insulating materials. In some embodiments, the levels of underfill may comprise thermoset epoxies with silicon oxide particles; in some embodiments, the levels of underfill may comprise any suitable material that can perform underfill functions such as supporting the dies and reducing thermal stress on interconnects. In some embodiments, the choice of underfill material may be based on design considerations, such as form factor, size, stress, operating conditions, etc.; in other embodiments, the choice of underfill material may be based on material properties and processing conditions, such as cure temperature, glass transition temperature, viscosity and chemical resistance, among other factors; in some embodiments, the choice of underfill material may be based on both design and processing considerations.

In some embodiments, one or more levels of solder resist (e.g., epoxy liquid, liquid photoimageable polymers, dry film photoimageable polymers, acrylics, solvents) may be provided in an IC package described herein and may not be labeled or shown to avoid cluttering the drawings. Solder resist may be a liquid or dry film material including photoimageable polymers. In some embodiments, solder resist may be non-photoimageable.

The terms "substantially," "close," "approximately," "near," and "about," generally refer to being within +/−20% of a target value (e.g., within +/−5% or 10% of a target value) based on the context of a particular value as described herein or as known in the art.

Terms indicating orientation of various elements, e.g., "coplanar," "perpendicular," "orthogonal," "parallel," or any other angle between the elements, generally refer to being within +/−5%-20% of a target value based on the context of a particular value as described herein or as known in the art.

The term "connected" means a direct connection (which may be one or more of a mechanical, electrical, and/or thermal connection) between the things that are connected, without any intermediary devices, while the term "coupled" means either a direct connection between the things that are connected, or an indirect connection through one or more passive or active intermediary devices.

The description uses the phrases "in an embodiment" or "in embodiments," which may each refer to one or more of the same or different embodiments.

Furthermore, the terms "comprising," "including," "having," and the like, as used with respect to embodiments of the present disclosure, are synonymous.

The disclosure may use perspective-based descriptions such as "above," "below," "top," "bottom," and "side"; such descriptions are used to facilitate the discussion and are not intended to restrict the application of disclosed embodiments.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers.

The term "dispose" as used herein refers to position, location, placement, and/or arrangement rather than to any particular method of formation.

The term "between," when used with reference to measurement ranges, is inclusive of the ends of the measurement ranges.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). When used herein, the notation "A/B/C" means (A), (B), and/or (C).

Although certain elements may be referred to in the singular herein, such elements may include multiple sub-elements. For example, "an electrically conductive material" may include one or more electrically conductive materials. In another example, "a dielectric material" may include one or more dielectric materials.

Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

The accompanying drawings are not necessarily drawn to scale.

In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated. Further, the singular and plural forms of the labels may be used with reference numerals to denote a single one and multiple ones respectively of the same or analogous type, species, or class of element.

Furthermore, in the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using, e.g., images of suitable characterization tools such as scanning electron microscopy (SEM) images, transmission electron microscope (TEM) images, or non-contact profilometer. In such images of real structures, possible processing and/or surface defects could also be visible, e.g., surface roughness, curvature or profile deviation, pit or scratches, not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication and/or packaging.

Although some components of the assembly in the figures are illustrated as being planar rectangles or formed of rectangular solids, this is simply for ease of illustration, and embodiments of these assemblies may be curved, rounded, or otherwise irregularly shaped as dictated by and sometimes inevitable due to the manufacturing processes used to fabricate various components. Note that the figures are intended to show relative arrangements of the components within their assemblies, and that, in general, such assemblies may include other components that are not illustrated (e.g., various interfacial layers or various other components related to optical functionality, electrical connectivity, or thermal mitigation). For example, in some further embodiments, the assemblies as shown in the figures may include more IC dies along with other electrical components.

In the drawings, a particular number and arrangement of structures and components are presented for illustrative purposes and any desired number or arrangement of such structures and components may be present in various embodiments.

Further, unless otherwise specified, the structures shown in the figures may take any suitable form or shape according to material properties, fabrication processes, and operating conditions.

Figure 10:
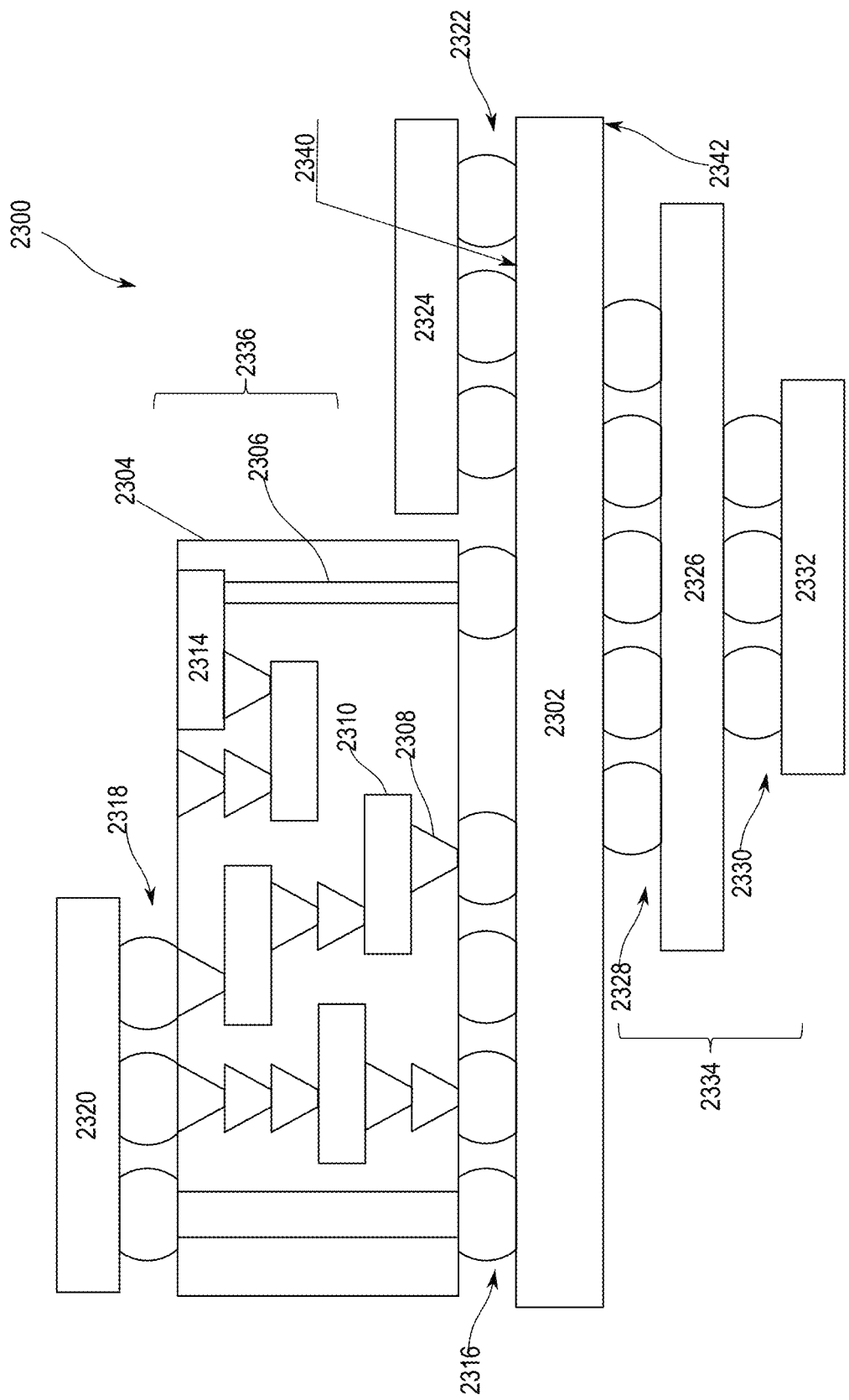
FIG. 10 is a cross-sectional side view of a device assembly that includes one or more microelectronic assemblies in accordance with any of the embodiments disclosed herein.

For convenience, if a collection of drawings designated with different letters are present (e.g., FIGS. 10A-10C), such a collection may be referred to herein without the letters (e.g., as "FIG. 10"). Similarly, if a collection of reference numerals designated with different letters are present (e.g., 112a-112e), such a collection may be referred to herein without the letters (e.g., as "112").

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

EXAMPLE EMBODIMENTS

FIG. 1A is a simplified block diagram and schematic top view of a microelectronic assembly 100 according to some embodiments of the present disclosure. Microelectronic assembly 100 comprises a plurality of IC dies 102 in synchronous communication with each other at respective supply voltages over conductive pathways in an interposer 104. For example, IC die 102(1) may comprise a transmitter circuit (TX) 106(1) and a receiver circuit (RX) 108(1) that respectively communicate with RX 108(1) and TX 106(2) in IC die 102(2) over corresponding conductive pathways 110(1) and 110(2) in interposer 104. Transmission over conductive pathway 110(1) from TX 106(1) to RX 108(2) may be at supply voltage VCC1 whereas transmission over conductive pathway 110(2) from TX 106(2) to RX 108(1) may be at supply voltage VCC2, different from VCC1.

Further, in an example operation, IC die 102(1) may transmit data to IC die 102(2) at a first frequency (e.g., 2 GHz). Given the process node and process speed skew of IC die 102(1), 2 GHz operation may require 0.7V VCC1. Thus, data and clock signals at 0.7V is forwarded from IC die 102(1) through interposer 104 to IC die 102(2). Simultaneously with this transmission, IC die 102(2) may send data to both IC die 102(1) and 102(3) at 3 GHz. According to the FV curve of IC die 102(2), which is different from the FV curves of IC dies 102(1) and 102(3), 3 GHz may correspond to 0.8V. Thus, data and clock signals may be forwarded from IC die 102(2) to IC dies 102(1) and 102(3) at 0.8V through interposer 104.

If, in the preceding example, the receiving IC die requires a higher voltage level than what the optimized sender IC die requires for the transmitted frequency, then the higher of the two voltages may be forwarded to ensure timing is met. Each IC die 102(1), 102(2), 102(3), 102(4) may have its own power management controller which determines what frequency it needs to run at, for example, based on dynamic compute or bandwidth loads. Each IC die 102(1), 102(2), 102(3), 102(4) may also have a FV curve associated with it and programmed or fused in some fashion during testing. During operation, the sender IC die is configured to determine, based on its power management algorithm (embedded or otherwise), what FV point to operate at and thus determines both the frequency and the voltage level that it will send over interposer 104 and the receiver IC die, independent of the FV curve or power management algorithm of the receiver IC die.

Likewise, IC die 102(1) may communicate with IC dies 102(3) and 102(4) at supply voltage VCC1 through interposer 104, whereas IC die 102(3) may communicate with IC die 102(1) at VCC3 and IC die 102(4) may communicate with IC die 102(1) at VCC4. The same operating scheme may apply for the other IC dies 102 as shown in the figure. Each such communication may be through different conductive pathways 110 in interposer 104. Thus, interposer 104 functions as a switch or cross-bar between IC dies 102. Interposer 104 may allow simultaneous communication between the plurality of IC dies 102 while forwarding different supply voltages across different conductive pathways 110. By forwarding and receiving different supply voltages from any IC die to any other IC die in microelectronic assembly 100 through interposer 104, die-independent DVFS operation is facilitated.

Figure 1B:
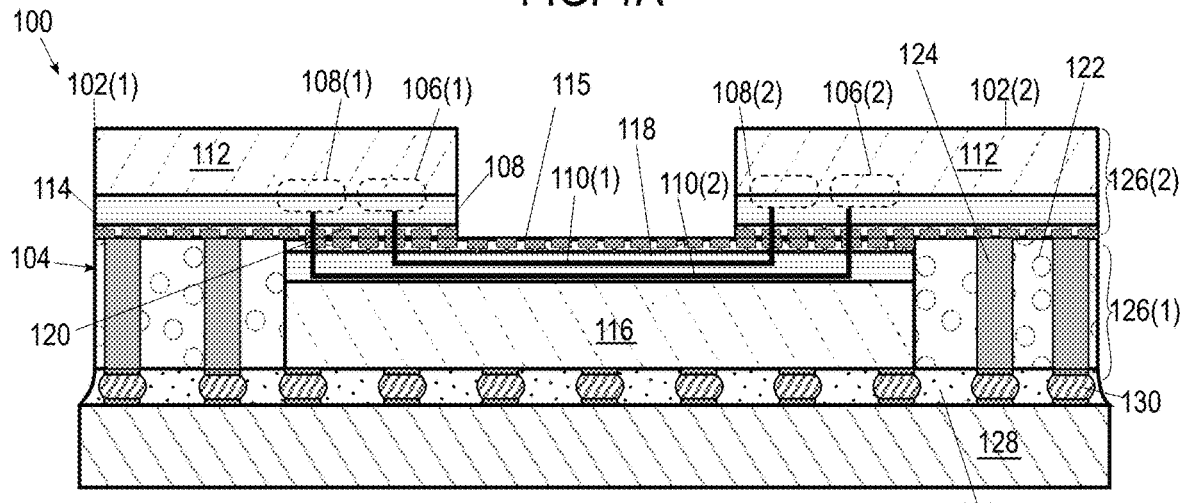
FIG. 1B is a simplified cross-sectional view of the example microelectronic assembly of FIG. 1, according to an embodiment of the present disclosure.

FIG. 1B is a simplified cross-sectional view of an example microelectronic assembly 100 of FIG. 1A, according to various embodiments of the present disclosure. IC dies 102 (1)-102(4) may be stacked over interposer 104. Each IC die 102 may comprise a substrate 112 and a metallization stack 114 parallel and adjacent to substrate 112. In some embodiments, portions of an active region (not shown) comprising isolated transistors, diodes, and other active elements of the microcontroller circuit may be disposed in substrate 112 and other portions of the active region may be disposed in metallization stack 114 in some embodiments. TX 106 and RX 108 may be located in the active region and metallization stack 114 of IC die 102.

Substrate 112 may comprise materials discussed in the paragraphs above relating to substrates (e.g., base material) of IC dies. Metallization stack 114 may include interlayer dielectric (ILD) and various layers of conductive material comprising conductive traces electrically coupled by conductive vias through the ILD. Other materials or/and layers, such as seed layers, adhesion layers, intermetallic compounds, not specifically shown the figure so as not to clutter the drawings may also be provided as may be known to those skilled in the art. Electrical signals, such as power and/or input/output (IO) signals, may be routed to and/or from logic circuit elements (e.g., the transistors) of the active region through one or more conductive interconnect layers situated in metallization stack 114. The layers of conductive traces may comprise one or more power grids (e.g., an arrangement of conductive lines, planes and vias, that is used to provide power), signal grids (e.g., an arrangement of conductive lines, planes and vias that is used to provide signals (e.g., data)), and/or ground grids (e.g., an arrangement of conductive lines, planes and vias that is used to provide ground connection).

In some embodiments, the conductive traces within metallization stack 114 may include lines and/or vias filled with an electrically conductive material such as aluminum or copper. The lines comprising the conductive traces may be arranged to route electrical signals in a direction of a plane that is parallel with a surface of substrate 112. For example, the lines may route electrical signals in a direction in and out of the page from the perspective of FIG. 1B. Vias may be arranged to route electrical signals in a direction of a plane that is perpendicular to the surface of substrate 112. In some embodiments, the vias may electrically couple lines of different conductive routing layers together.

The ILD may comprise layers between the layers of conductive traces, the ILD layers deposited over and in between the conductive traces. The ILD layers may be formed using dielectric materials known for their applicability in IC structures, such as low-k dielectric materials. Examples of dielectric materials include, but are not limited to, silicon dioxide (SiO2), carbon-doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant. The ILD may comprise a homogeneous material, or a heterogeneous layered composite comprising more than one layer of material, or a heterogeneous matrix comprising a mixture of materials in any suitable arrangement known in the art In some embodiments, interposer 104 may comprise an IC die 115, in which case, IC die 115 may also comprise the same structure as described for IC die 102, for example, a substrate 116 and a metallization stack 118. In some embodiments, an active region may be absent in interposer 104, although in other embodiments, the active region may be present between substrate 116 and metallization stack 118.

IC dies 102 may be coupled to interposer 104 with DTD interconnects 120 having a pitch of less than 10 micrometers between adjacent ones of the interconnects. Conductive pathway 110 through interposer 104 may pass through one or more of DTD interconnects 120. For example, conductive pathway 110(1) between TX 106(1) in IC die 102(1) and RX 108(2) in IC die 102(2) may pass through at least one DTD interconnect 120 between IC die 102(1) and interposer 104, and another DTD interconnect 120 between IC die 102(2) and interposer 104. Likewise, conductive pathway 110(2) between TX 106(2) in IC die 102(2) and RX 108(1) in IC die 102(1) may pass through at least one DTD interconnect 120 between IC die 102(1) and interposer 104, and another DTD interconnect 120 between IC die 102(2) and interposer 104. In some embodiments, any one conductive pathway 110 may comprise more than one conductive trace; for example, a first conductive trace for data signals and another conductive trace for clock signals.

In various embodiments, interposer 104 may further comprise a dielectric material 122 surrounding IC die 115 and TDVs 124 in dielectric 122. Microelectronic assembly 100 may comprise a plurality of layers 126. Interposer 104 may be located in a first layer 126(1), and IC dies 102 may be located in a second layer 126(2) not coplanar with first layer 126(1). More layers than are shown in the figure may be provided within the broad scope of the embodiments. A package substrate 128 may be coupled to layer 126(1) with DTPS interconnects 130. An underfill 132 between layer 126(1) and package substrate 128 may provide thermo-mechanical reliability to DTPS interconnects 130. Underfill 220 may comprise materials described in the paragraphs above relating to underfills. In many embodiments, the pitch of DTPS interconnects 130 may be larger than the pitch of DTD interconnects 120.

TDVs 124 may electrically couple DTPS interconnects 130 with one or more layers 126. In microelectronic assemblies with more number of layers than shown in the figure, TDVs 124 may also electrically couple components in one layer with components in another layer. In some embodiments, all TDVs 124 may be of the same size; in other embodiments, TDVs 124 may be of different sizes, for example, some may carry power and may be larger than others that carry signals and are smaller. In some embodiments, some TDVs 124 may be spaced farther apart from each other than other TDVs 124, whereas in other embodiments, TDVs 124 may all be uniformly spaced apart, depending on their functionalities, assembly footprint, and other design and manufacturing considerations.

Note that in FIG. 1B and in subsequent figures, the DTD interconnects (e.g., 120) are shown as aligned at the respective interfaces merely for ease of illustration; in actuality, some, or all of them may be misaligned. In addition, there may be other components, such as bond pads, landing pads, metallization, etc. present in the assembly that are not shown in the figures to prevent cluttering.

Figure 2:
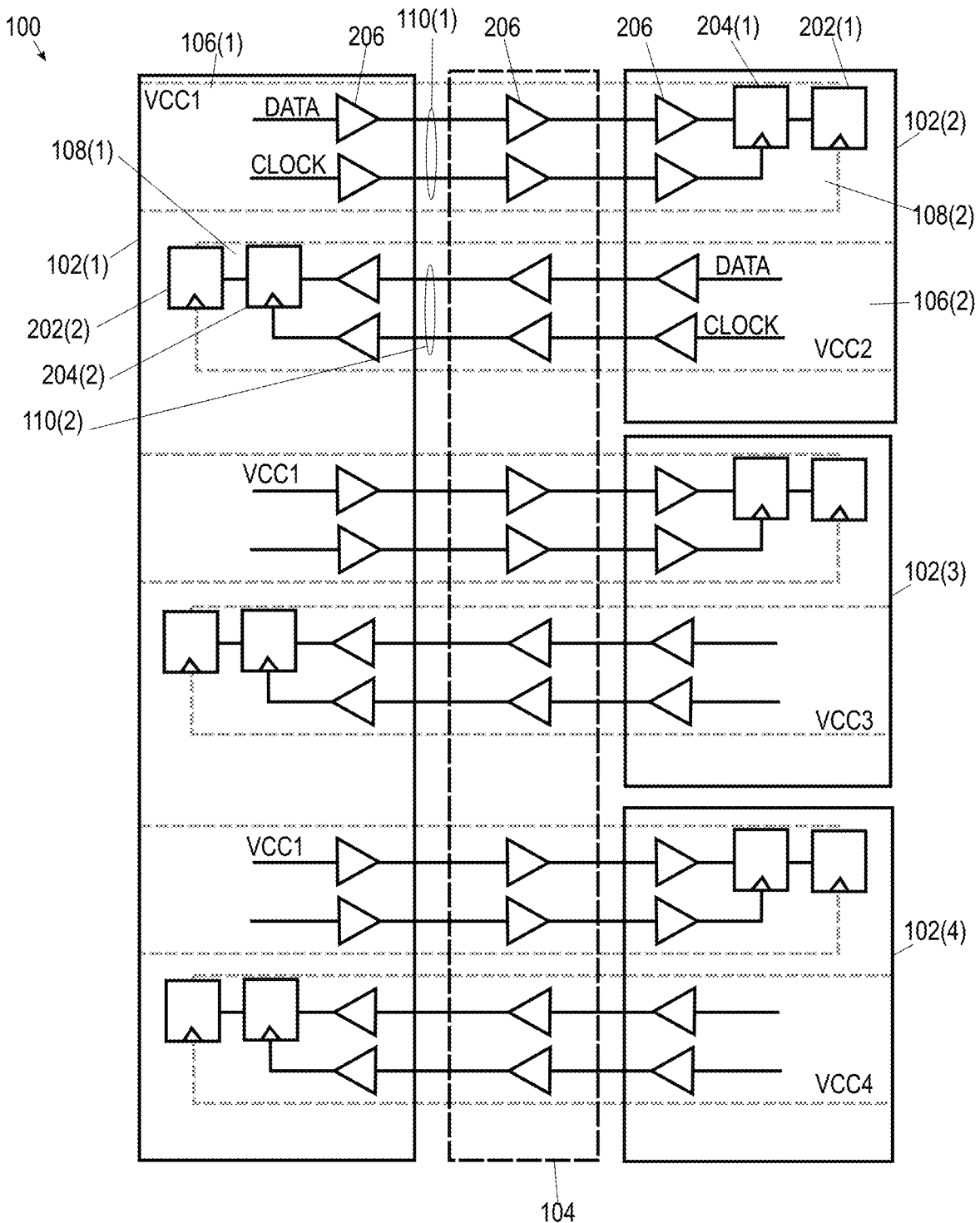
FIG. 2 is a simplified block diagram of a portion of the example microelectronic assembly of FIG. 1, according to an embodiment of the present disclosure.

FIG. 2 is a simplified block diagram showing an example schematic of connections between IC dies 102(1) with IC dies 102(2)-102(4) through interposer 104. Each receiver circuit 108 may comprise a level shifter and frequency module (e.g., a first-in first-out (FIFO) circuit) 202 and the receiving flop circuit (or equivalent) 204. In addition, conductive pathway 110 may comprise repeaters 206 coupled to the conductive traces in some embodiments. Each conductive pathway 110 may comprise a separate conductive trace to transmit data signals and another to transmit clock signals. For example, TX 106(1) may be coupled to RX 108(2), which includes level shifter and frequency module 202(1) and receiving flop circuit 204(1); TX 106(2) may be coupled to RX 108(1), which includes level shifter and frequency module 202(2) and receiving flop circuit 204(2). TX 106(1) may transmit data and clock signals at a first frequency F1 to RX 108(2) at supply voltage VCC1 over conductive pathway 110(1). F1 may correspond to the maximum operating frequency at voltage VCC1 according to the FV curve of IC die 102(1). Level shifter and frequency module 202(1) may sense the frequency of the received data and clock signals, choose an optimum voltage level for IC die 102(2) based on the FV curve of IC die 102(2), and change the supply voltage from VCC1 to the determined optimum voltage level.

Synchronously with transmission of data and clock signals from IC die 102(1) to IC die 102(2), data and clock signals may be received from IC die 102(2) at IC die 102(1) at a different supply voltage VCC2 and a different frequency F2. F2 may correspond to the maximum operating frequency at voltage VCC2 according to the FV curve of IC die 102(2). Level shifter and frequency module 202(2) may sense the frequency of the received data and clock signals and choose an optimum voltage level for IC die 102(1) based on the FV curve of IC die 102(1), determine an optimum voltage level for IC die 102(1) and change the supply voltage from VCC2 to the determined optimum voltage level. The same (or similar) scheme may be followed for conductive pathways between IC dies 102(1) and 102(3)-102(4) (and other IC dies with which IC die 102(1) is in communication).

Figure 3:
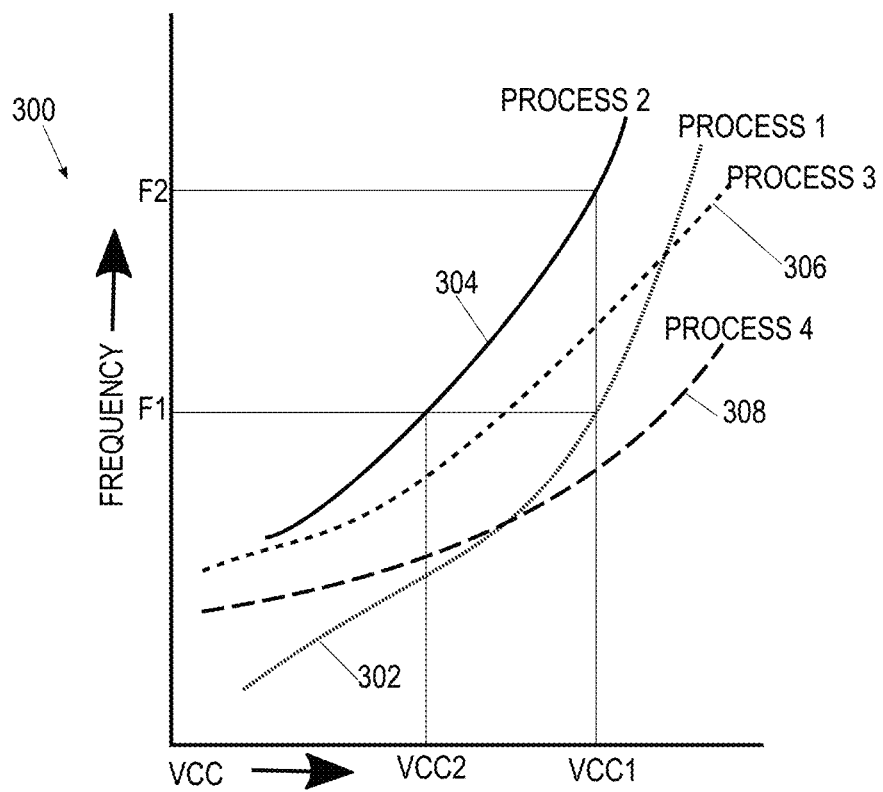
FIG. 3 is a schematic graph showing frequency versus supply voltage for different semiconductor manufacturing processes.

FIG. 3 is a simplified graph showing example FV curves of various processes. FV curve 302 corresponds to process 1 used to fabricate IC die 102(1); FV curve 304 corresponds to process 2 used to fabricate IC die 102(2); FV curve 306 corresponds to process 3 used to fabricate IC die 102(3); FV curve 308 corresponds to process 4 used to fabricate IC die 102(4). At VCC1, for example, the maximum operating frequency for process 1 is F1, whereas it is F2 for process 2. Likewise, frequency F1 corresponds to supply voltage VCC1 for process 1 and VCC2 for process 2. Embodiments of microelectronic assembly 100 may facilitate operation of each individual IC die 102 according to its respective FV curve. Thus, for example, DVFS scaling of voltage (or frequency) may be performed on IC die 102(1) without changing the frequency and/or voltage of transmission by IC die 102(2), IC die 102(3), or IC die 102(4). Thus, DVFS of IC die 102(1) (or any other IC die in microelectronic assembly 100) may be performed without consideration of the FV curves and/or optimum frequencies and voltages of any other IC dies in microelectronic assembly 100 with which IC die 102(1) is in communication. Such a die-agnostic DVFS scheme may be facilitated by the separate communicative pathways 110 through interposer 104.

Figure 4:
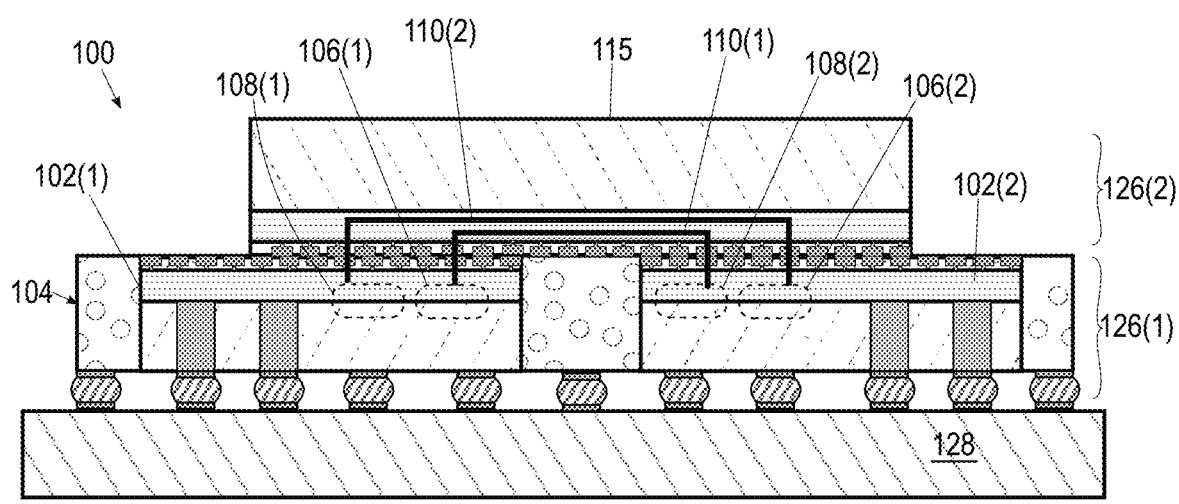
FIG. 4 is a simplified cross-sectional view of an example microelectronic assembly, according to another embodiment of the present disclosure.

FIG. 4 is a simplified cross-sectional view of another example microelectronic assembly 100, according to various embodiments of the present disclosure. In the embodiment shown, interposer 104 in layer 126(1) comprises IC dies 102 (e.g., 102(1) and 102(2)), and IC die 115 having conductive pathway 110 (e.g., 110(1) and 110(2)) is not in interposer 104, but rather in a different layer 126(2), for example, atop interposer 104 (as shown). In some embodiments, IC die 115 may be beneath interposer 104. Interposer 104 comprising IC dies 102 may be coupled to package substrate 128 by interconnects 130.

Figure 5A:
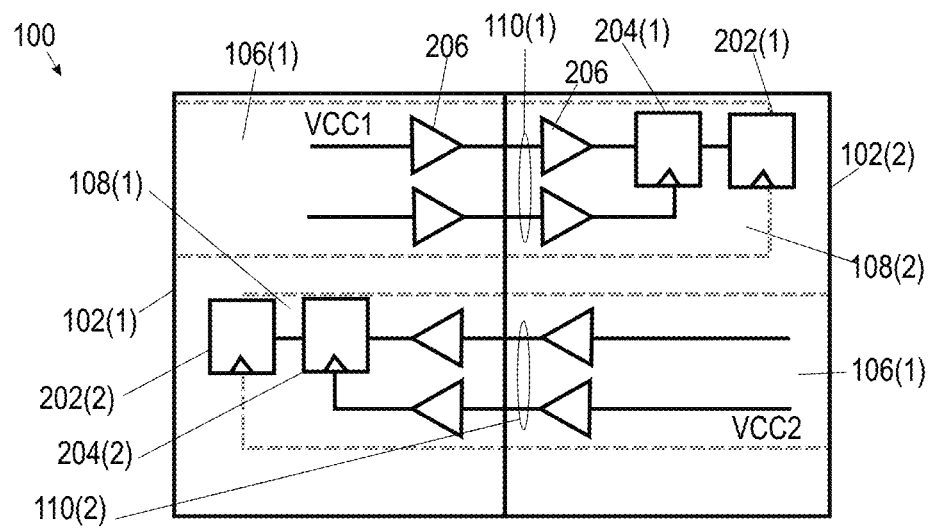
FIG. 5A is a simplified block diagram of an example microelectronic assembly, according to yet another embodiment of the present disclosure.
Figure 5B:
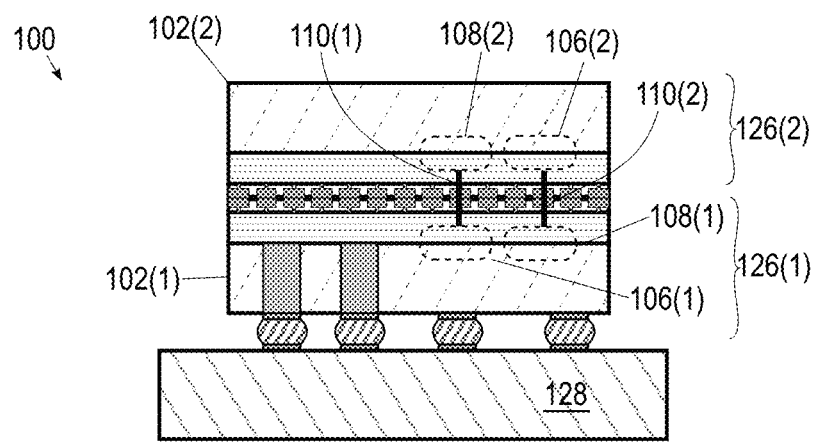
FIG. 5B is a simplified cross-sectional view of the example microelectronic assembly of FIG. 5A.

FIG. 5A is a simplified block diagram illustrating an example embodiment of microelectronic assembly 100. In the embodiment shown, two IC dies 102(1) and 102(2) in communication with each other are not in the same layer 126. For example, as shown in FIG. 5B, which is a simplified cross-sectional view of the example microelectronic assembly 100 of FIG. 5A, IC die 102(1) may be in layer 126(1) and IC die 102(2) may be in layer 126(2). In such embodiments, interposer 104 may be absent (e.g., as shown), or alternatively, IC die 102(1) (or IC die 102(2)) may be in interposer 104. Also, there is no intervening IC die 115 between IC dies 102(1) and 102(2).

Figure 6:
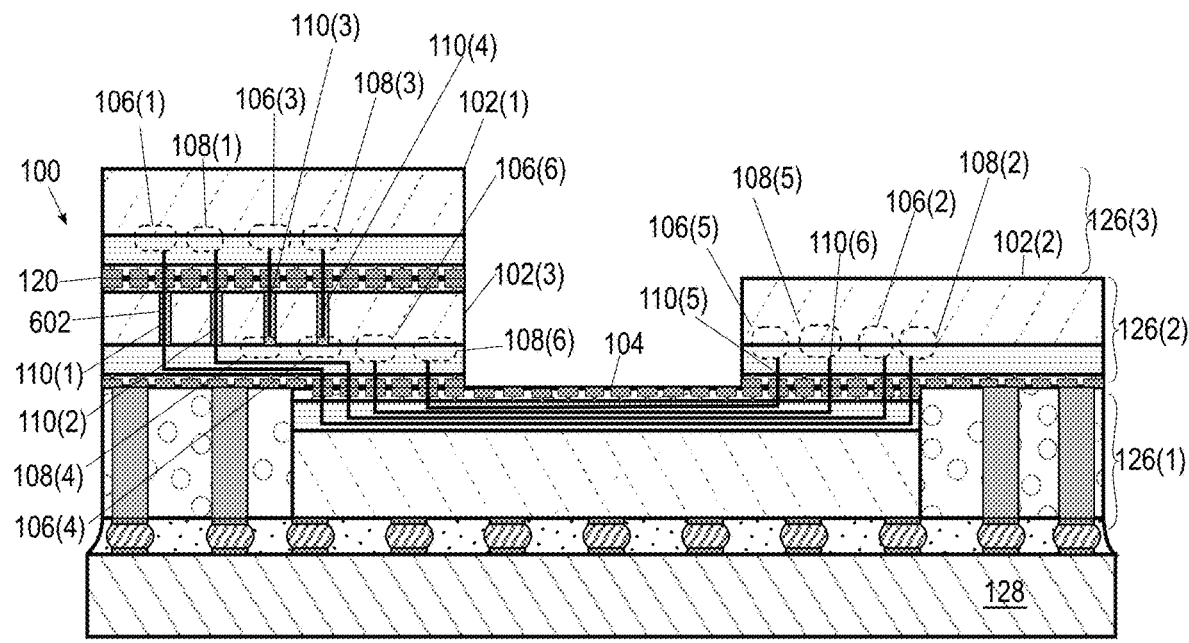
FIG. 6 is a simplified cross-sectional view of the example microelectronic assembly, according to yet another embodiment of the present disclosure.

FIG. 6 is a simplified cross-sectional view of an example microelectronic assembly 100 according to various embodiments. IC die 102(1) may comprise TX 106(1), which may communicate with RX 108(2) in IC die 102(2) through conductive pathway 110(1) in interposer 104. Likewise, TX 106(2) in IC die 102(2) may communicate with RX 108(1) in IC die 102(1) through conductive pathway 110(2) in interposer 104. In the embodiment shown, because IC dies 102(1) and 102(3) are coupled together in a front-to-back configuration, conductive pathways 110(1) and 110(2) pass through TSVs 602 in IC die 102(3) stacked between IC die 102(1) and interposer 104.

Another TX 106(3) in IC die 102(1) may communicate with RX 108(4) in IC die 102(3) through conductive pathway 110(3); TX 106(4) in IC die 102(3) may communicate with RX 108(3) in IC die 102(1) through conductive pathway 110(4). Conductive pathways 110(3) and 110(4) may be through IC die 102(3) instead of through interposer 104; for example, conductive pathways 110(3) and 110(4) may be through interconnects 120 between IC dies 102(1) and 102(3) and TSVs 602 in IC die 102(3). In embodiments, such as that shown in FIG. 5B, where the two stacked dies are in front-to-front configuration, TSV 602 may not be needed during operation for this particular communication between stacked dies without interposer 104.

Any number of IC dies 102 may be coupled over interposer 104 within the broad scope of the embodiments. For example, another TX 106(5) in IC die 102(2) may communicate with RX 108(6) in IC die 102(3) through conductive pathway 110(5) through interposer 104; TX 106(6) in IC die 102(3) may communicate with RX 108(5) in IC die 102(2) through conductive pathway 110(6) through interposer 104.

In the embodiment shown, microelectronic assembly 100 contains three layers 126: 126(1), 126(2) and 126(3). Interposer 104 is in layer 126(1); IC dies 102(2) and 102(3) are in layer 126(2); and IC die 102(1) is in layer 126(3). Note that layers 126 and IC dies 102 shown are merely as examples and not as limitations. Any number of IC dies 102 and layers 126 may be present in microelectronic assembly 100 within the broad scope of the embodiments.

Figure 7:
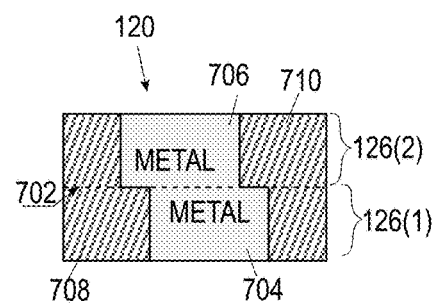
FIG. 7 is a simplified cross-sectional view of a hybrid bond in an example microelectronic assembly, according to various embodiments.

FIG. 7 shows an individual one of an example embodiment of DTD interconnects 120 comprising hybrid bonds in greater detail. At interface 702 between layers 126(1) and 126(2), for example, between interposer 104 (or IC die 115 in interposer 104) in layer 126(1) and IC die 102 in layer 126(2), conductive contact 704 belonging to layer 126(1) may bond with conductive contact 706 of layer 126(2); likewise, dielectric 708 (e.g., silicon oxide, silicon nitride, silicon oxynitride, etc.) in layer 126(1) may bond with dielectric 710 in layer 126(2). The bonded interconnects form DTD interconnects 120, comprising hybrid bonds, providing electrical and mechanical coupling between layers 126(1) and 126(2).

Figure 8:
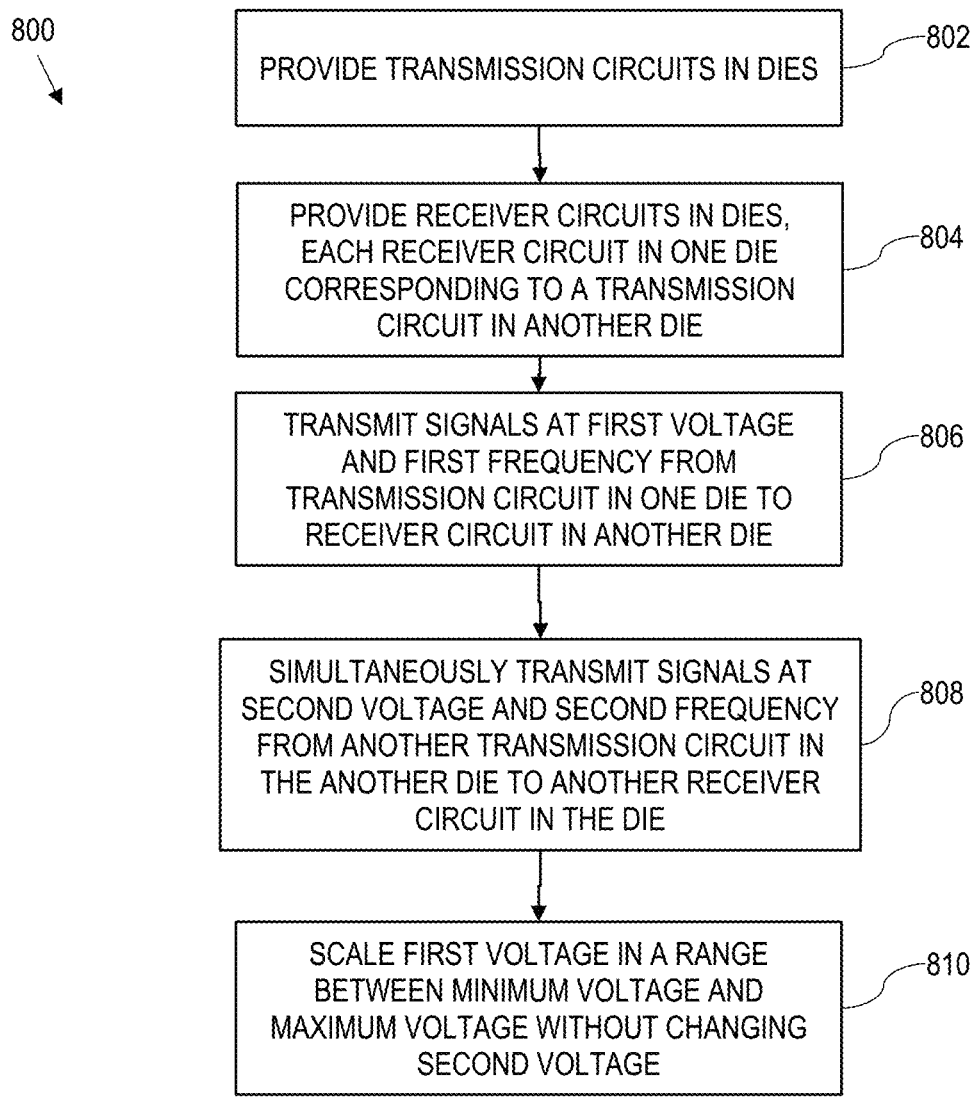
FIG. 8 is a simplified flow diagram associated with a method of operation of an example microelectronic assembly, according to various embodiments.

FIG. 8 is a simplified flow diagram illustrating example operations 800 that may be associated with embodiments of microelectronic assembly 100. At 802 TX 106 may be provided in a plurality of IC dies 102. At 804, RX 108 may be provided in the plurality of IC dies 102. Each RX 108 in one IC die of the plurality of IC dies 102 may correspond to and communicate with TX 106 in another one of the plurality of IC dies 102 over conductive pathway 110. For example, TX 106(1) in IC die 102(1) may communicate with RX 108(2) in IC die 102(2) over conductive pathway 110(1); TX 106(2) in IC die 102(2) may communicate with RX 108(1) in IC die 102(1) over conductive pathway 110(2). At 806, signals (e.g., data and clock signals) may be transmitted at a first voltage (e.g., VCC1) and first frequency (e.g., F1) from TX 106 (e.g., TX 106(1)) in one of the plurality of IC dies 102 (e.g., IC die 102(1)) to corresponding RX 108 (e.g., RX 108(2)) in another one of the plurality of IC dies 102 (e.g., IC die 102(2)) over conductive pathway 110 (e.g., 110(1)). At 808, simultaneously as the transmission at 806, another TX 106 (e.g., 106(2)) in the plurality of IC dies 102 (e.g., 102(2)) may transmit signals (e.g., data and clock signals) at a second voltage (e.g., VCC2) and second frequency (e.g., F2) to corresponding RX (e.g., RX 108(1)) in another one of the plurality of IC dies 102 (e.g., 102(1)). At 810, the first voltage (e.g., VCC1) (and corresponding frequency) may be scaled in a range between a minimum voltage and a maximum voltage without changing the second voltage (e.g., VCC2).

In various embodiments, any of the features discussed with reference to any of FIGS. 1-8 herein may be combined with any other features to form a package with one or more IC dies as described herein, for example, to form a modified microelectronic assembly 100. Some such combinations are described above, but, in various embodiments, further combinations and modifications are possible.

Example Devices and Components

Figure 9:
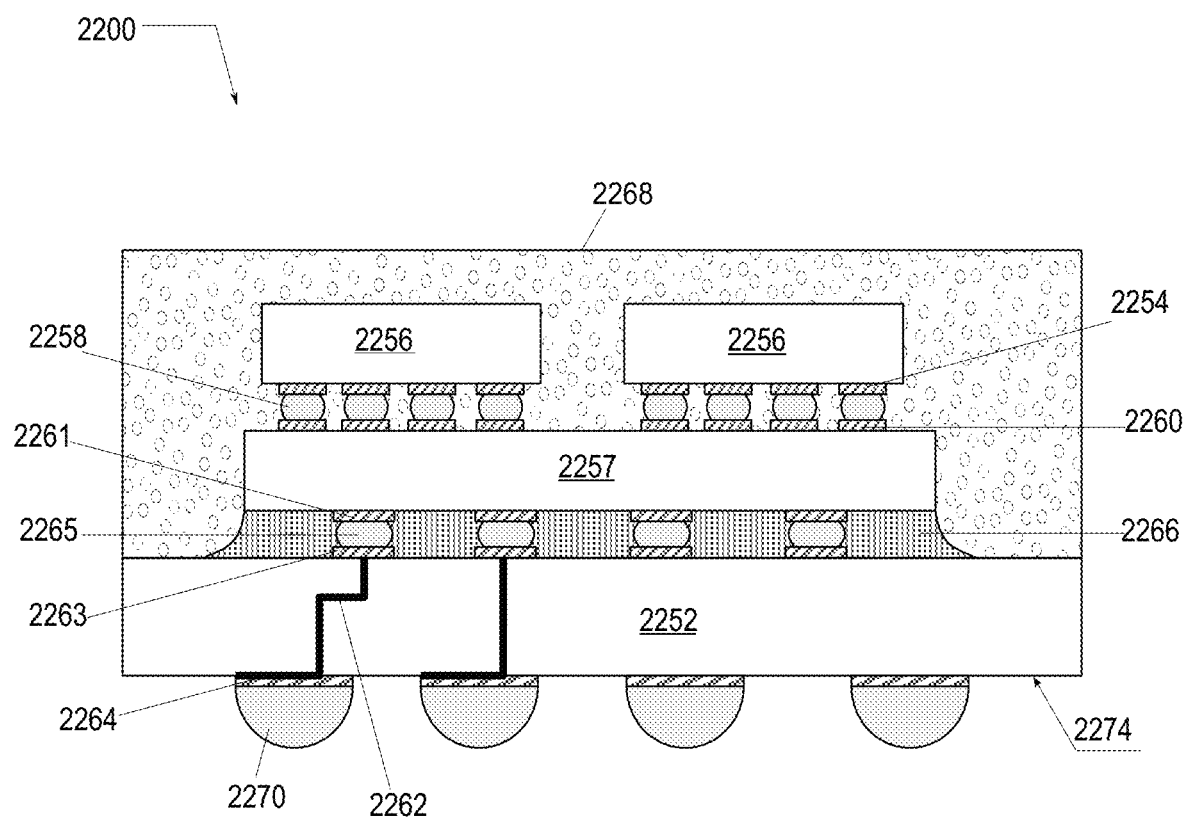
FIG. 9 is a cross-sectional view of a device package that includes one or more microelectronic assemblies in accordance with any of the embodiments disclosed herein.
Figure 11:
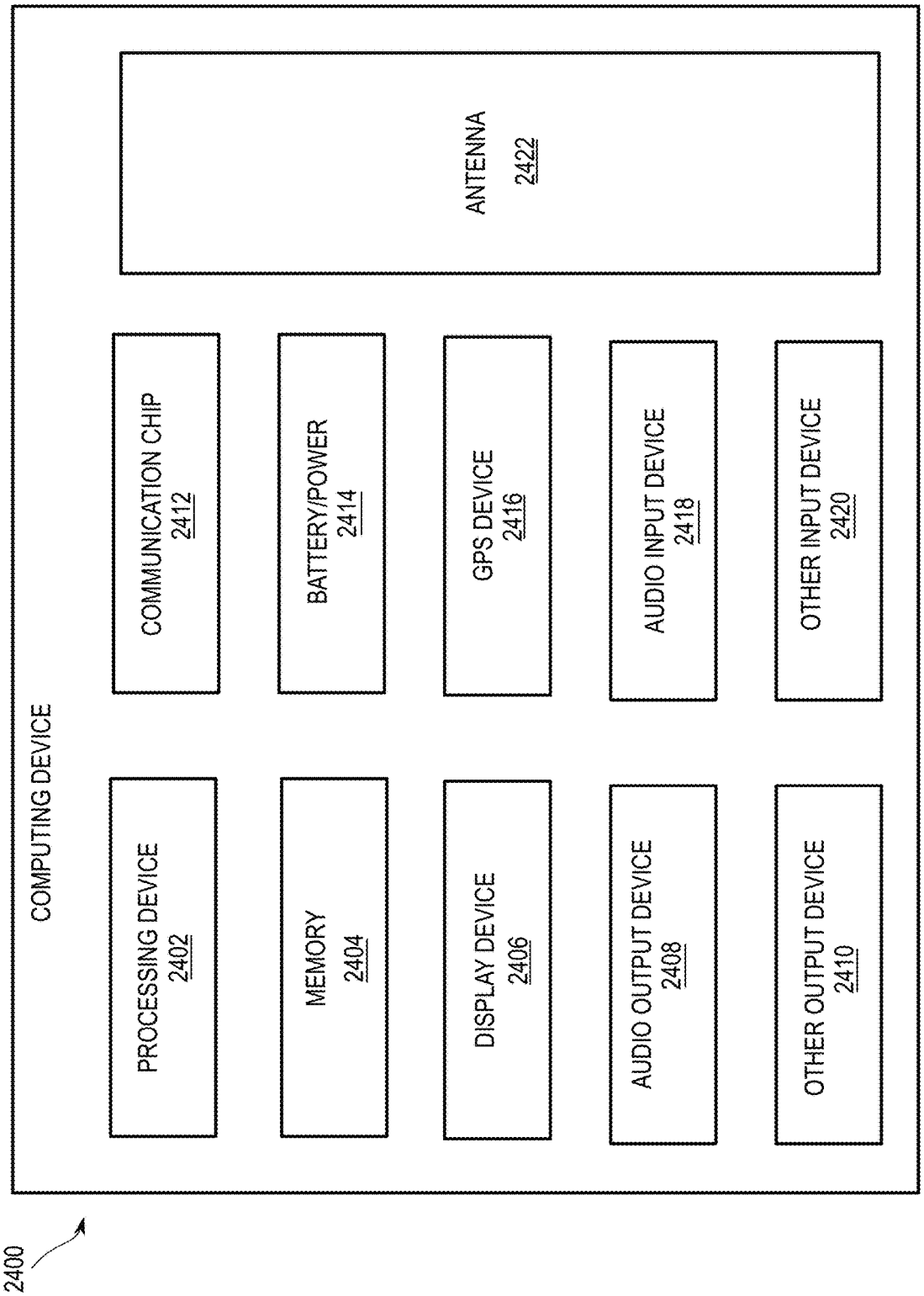
FIG. 11 is a block diagram of an example computing device that includes one or more microelectronic assemblies in accordance with any of the embodiments disclosed herein.

The packages disclosed herein, e.g., any of the embodiments shown in FIGS. 1-8 or any further embodiments described herein, may be included in any suitable electronic component. FIGS. 9-11 illustrate various examples of packages, assemblies, and devices that may be used with or include any of the IC packages as disclosed herein.

FIG. 9 is a side, cross-sectional view of an example IC package 2200 that may include IC packages in accordance with any of the embodiments disclosed herein. In some embodiments, the IC package 2200 may be a system-in-package (SiP).

As shown in the figure, package substrate 2252 may be formed of an insulator (e.g., a ceramic, a buildup film, an epoxy film having filler particles therein, etc.), and may have conductive pathways extending through the insulator between first face 2272 and second face 2274, or between different locations on first face 2272, and/or between different locations on second face 2274. These conductive pathways may take the form of any of the interconnect structures comprising lines and/or vias.

Package substrate 2252 may include conductive contacts 2263 that are coupled to conductive pathway 2262 through package substrate 2252, allowing circuitry within dies 2256 and/or interposer 2257 to electrically couple to various ones of conductive contacts 2264 (or to other devices included in package substrate 2252, not shown).

IC package 2200 may include interposer 2257 coupled to package substrate 2252 via conductive contacts 2261 of interposer 2257, first-level interconnects 2265, and conductive contacts 2263 of package substrate 2252. First-level interconnects 2265 illustrated in the figure are solder bumps, but any suitable first-level interconnects 2265 may be used, such as solder bumps, solder posts, or bond wires.

IC package 2200 may include one or more dies 2256 coupled to interposer 2257 via conductive contacts 2254 of dies 2256, first-level interconnects 2258, and conductive contacts 2260 of interposer 2257. Conductive contacts 2260 may be coupled to conductive pathways (not shown) through interposer 2257, allowing circuitry within dies 2256 to electrically couple to various ones of conductive contacts 2261 (or to other devices included in interposer 2257, not shown). First-level interconnects 2258 illustrated in the figure are solder bumps, but any suitable first-level interconnects 2258 may be used, such as solder bumps, solder posts, or bond wires. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, underfill material 2266 may be disposed between package substrate 2252 and interposer 2257 around first-level interconnects 2265, and mold 2268 may be disposed around dies 2256 and interposer 2257 and in contact with package substrate 2252. In some embodiments, underfill material 2266 may be the same as mold 2268. Example materials that may be used for underfill material 2266 and mold 2268 are epoxies as suitable. Second-level interconnects 2270 may be coupled to conductive contacts 2264. Second-level interconnects 2270 illustrated in the figure are solder balls (e.g., for a ball grid array (BGA) arrangement), but any suitable second-level interconnects 2270 may be used (e.g., pins in a pin grid array arrangement or lands in a land grid array arrangement). Second-level interconnects 2270 may be used to couple IC package 2200 to another component, such as a circuit board (e.g., a motherboard), an interposer, or another IC package, as known in the art and as discussed below with reference to FIG. 10.

In various embodiments, any of dies 2256 may be microelectronic assembly 100 as described herein. In embodiments in which IC package 2200 includes multiple dies 2256, IC package 2200 may be referred to as a multi-chip package (MCP). Dies 2256 may include circuitry to perform any desired functionality. For example, besides one or more of dies 2256 being microelectronic assembly 100 as described herein, one or more of dies 2256 may be logic dies (e.g., silicon-based dies), one or more of dies 2256 may be memory dies (e.g., high-bandwidth memory), etc. In some embodiments, any of dies 2256 may be implemented as discussed with reference to any of the previous figures. In some embodiments, at least some of dies 2256 may not include implementations as described herein.

Although IC package 2200 illustrated in the figure is a flip-chip package, other package architectures may be used. For example, IC package 2200 may be a BGA package, such as an embedded wafer-level ball grid array (eWLB) package. In another example, IC package 2200 may be a wafer-level chip scale package (WLCSP) or a panel fan-out (FO) package. Although two dies 2256 are illustrated in IC package 2200, IC package 2200 may include any desired number of dies 2256. IC package 2200 may include additional passive components, such as surface-mount resistors, capacitors, and inductors disposed over first face 2272 or second face 2274 of package substrate 2252, or on either face of interposer 2257. More generally, IC package 2200 may include any other active or passive components known in the art.

In some embodiments, no interposer 2257 may be included in IC package 2200; instead, dies 2256 may be coupled directly to conductive contacts 2263 at first face 2272 by first-level interconnects 2265.

FIG. 10 is a cross-sectional side view of an IC device assembly 2300 that may include components having one or more microelectronic assembly 100 in accordance with any of the embodiments disclosed herein. IC device assembly 2300 includes a number of components disposed over a circuit board 2302 (which may be, e.g., a motherboard). IC device assembly 2300 includes components disposed over a first face 2340 of circuit board 2302 and an opposing second face 2342 of circuit board 2302; generally, components may be disposed over one or both faces 2340 and 2342. In particular, any suitable ones of the components of IC device assembly 2300 may include any of the one or more microelectronic assembly 100 in accordance with any of the embodiments disclosed herein; e.g., any of the IC packages discussed below with reference to IC device assembly 2300 may take the form of any of the embodiments of IC package 2200 discussed above with reference to FIG. 9.

In some embodiments, circuit board 2302 may be a PCB including multiple metal layers separated from one another by layers of insulator and interconnected by electrically conductive vias. Any one or more of the metal layers may be formed in a desired circuit pattern to route electrical signals (optionally in conjunction with other metal layers) between the components coupled to circuit board 2302. In other embodiments, circuit board 2302 may be a non-PCB package substrate.

As illustrated in the figure, in some embodiments, IC device assembly 2300 may include a package-on-interposer structure 2336 coupled to first face 2340 of circuit board 2302 by coupling components 2316. Coupling components 2316 may electrically and mechanically couple package-on-interposer structure 2336 to circuit board 2302, and may include solder balls (as shown), male and female portions of a socket, an adhesive, an underfill material, and/or any other suitable electrical and/or mechanical coupling structure.

Package-on-interposer structure 2336 may include IC package 2320 coupled to interposer 2304 by coupling components 2318. Coupling components 2318 may take any suitable form depending on desired functionalities, such as the forms discussed above with reference to coupling components 2316. In some embodiments, IC package 2320 may be or include IC package 2200, e.g., as described above with reference to FIG. 9. In some embodiments, IC package 2320 may include at least one microelectronic assembly 100 as described herein. Microelectronic assembly 100 is not specifically shown in the figure in order to not clutter the drawing.

Although a single IC package 2320 is shown in the figure, multiple IC packages may be coupled to interposer 2304; indeed, additional interposers may be coupled to interposer 2304. Interposer 2304 may provide an intervening package substrate used to bridge circuit board 2302 and IC package 2320. Generally, interposer 2304 may redistribute a connection to a wider pitch or reroute a connection to a different connection. For example, interposer 2304 may couple IC package 2320 to a BGA of coupling components 2316 for coupling to circuit board 2302.

In the embodiment illustrated in the figure, IC package 2320 and circuit board 2302 are attached to opposing sides of interposer 2304. In other embodiments, IC package 2320 and circuit board 2302 may be attached to a same side of interposer 2304. In some embodiments, three or more components may be interconnected by way of interposer 2304.

Interposer 2304 may be formed of an epoxy resin, a fiberglass-reinforced epoxy resin, a ceramic material, or a polymer material such as polyimide. In some implementations, interposer 2304 may be formed of alternate rigid or flexible materials that may include the same materials described above for use in a semiconductor substrate, such as silicon, germanium, and other group III-V and group IV materials. Interposer 2304 may include metal interconnects 2308 and vias 2310, including but not limited to TSVs 2306. Interposer 2304 may further include embedded devices 2314, including both passive and active devices. Such devices may include, but are not limited to, capacitors, decoupling capacitors, resistors, inductors, fuses, diodes, transformers, sensors, ESD devices, and memory devices. More complex devices such as radio frequency (RF) devices, power amplifiers, power management devices, antennas, arrays, sensors, and microelectromechanical systems (MEMS) devices may also be formed on interposer 2304. Package-on-interposer structure 2336 may take the form of any of the package-on-interposer structures known in the art.

In some embodiments, IC device assembly 2300 may include an IC package 2324 coupled to first face 2340 of circuit board 2302 by coupling components 2322. Coupling components 2322 may take the form of any of the embodiments discussed above with reference to coupling components 2316, and IC package 2324 may take the form of any of the embodiments discussed above with reference to IC package 2320.

In some embodiments, IC device assembly 2300 may include a package-on-package structure 2334 coupled to second face 2342 of circuit board 2302 by coupling components 2328. Package-on-package structure 2334 may include an IC package 2326 and an IC package 2332 coupled together by coupling components 2330 such that IC package 2326 is disposed between circuit board 2302 and IC package 2332. Coupling components 2328 and 2330 may take the form of any of the embodiments of coupling components 2316 discussed above, and IC packages 2326 and/or 2332 may take the form of any of the embodiments of IC package 2320 discussed above. Package-on-package structure 2334 may be configured in accordance with any of the package-on-package structures known in the art.

FIG. 11 is a block diagram of an example computing device 2400 that may include one or more components having one or more IC packages in accordance with any of the embodiments disclosed herein. For example, any suitable ones of the components of computing device 2400 may include a microelectronic assembly (e.g., 100) in accordance with any of the embodiments disclosed herein. In another example, any one or more of the components of computing device 2400 may include any embodiments of IC package 2200 (e.g., as shown in FIG. 9). In yet another example, any one or more of the components of computing device 2400 may include an IC device assembly 2300 (e.g., as shown in FIG. 10).

A number of components are illustrated in the figure as included in computing device 2400, but any one or more of these components may be omitted or duplicated, as suitable for the application. In some embodiments, some or all of the components included in computing device 2400 may be attached to one or more motherboards. In some embodiments, some or all of these components are fabricated onto a single SOC die.

Additionally, in various embodiments, computing device 2400 may not include one or more of the components illustrated in the figure, but computing device 2400 may include interface circuitry for coupling to the one or more components. For example, computing device 2400 may not include a display device 2406, but may include display device interface circuitry (e.g., a connector and driver circuitry) to which display device 2406 may be coupled. In another set of examples, computing device 2400 may not include an audio input device 2418 or an audio output device 2408, but may include audio input or output device interface circuitry (e.g., connectors and supporting circuitry) to which audio input device 2418 or audio output device 2408 may be coupled.

Computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. Processing device 2402 may include one or more DSPs, ASICs, CPUs, GPUs, cryptoprocessors (specialized processors that execute cryptographic algorithms within hardware), server processors, or any other suitable processing devices. Computing device 2400 may include a memory 2404, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, memory 2404 may include memory that shares a die with processing device 2402. This memory may be used as cache memory and may include embedded dynamic random access memory (eDRAM) or spin transfer torque magnetic random access memory (STT-MRAM).

In some embodiments, computing device 2400 may include a communication chip 2412 (e.g., one or more communication chips). For example, communication chip 2412 may be configured for managing wireless communications for the transfer of data to and from computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), LTE project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 2412 may operate in accordance with other wireless protocols in other embodiments. Computing device 2400 may include an antenna 2422 to facilitate wireless communications and/or to receive other wireless communications (such as AM or FM radio transmissions).

In some embodiments, communication chip 2412 may manage wired communications, such as electrical, optical, or any other suitable communication protocols (e.g., the Ethernet). As noted above, communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

Computing device 2400 may include battery/power circuitry 2414. Battery/power circuitry 2414 may include one or more energy storage devices (e.g., batteries or capacitors) and/or circuitry for coupling components of computing device 2400 to an energy source separate from computing device 2400 (e.g., AC line power).

Computing device 2400 may include a display device 2406 (or corresponding interface circuitry, as discussed above). Display device 2406 may include any visual indicators, such as a heads-up display, a computer monitor, a projector, a touchscreen display, a liquid crystal display (LCD), a light-emitting diode display, or a flat panel display, for example.

Computing device 2400 may include audio output device 2408 (or corresponding interface circuitry, as discussed above). Audio output device 2408 may include any device that generates an audible indicator, such as speakers, headsets, or earbuds, for example.

Computing device 2400 may include audio input device 2418 (or corresponding interface circuitry, as discussed above). Audio input device 2418 may include any device that generates a signal representative of a sound, such as microphones, microphone arrays, or digital instruments (e.g., instruments having a musical instrument digital interface (MIDI) output).

Computing device 2400 may include a GPS device 2416 (or corresponding interface circuitry, as discussed above). GPS device 2416 may be in communication with a satellite-based system and may receive a location of computing device 2400, as known in the art.

Computing device 2400 may include other output device 2410 (or corresponding interface circuitry, as discussed above). Examples of other output device 2410 may include an audio codec, a video codec, a printer, a wired or wireless transmitter for providing information to other devices, or an additional storage device.

Computing device 2400 may include other input device 2420 (or corresponding interface circuitry, as discussed above). Examples of other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, computing device 2400 may be any other electronic device that processes data.

SELECT EXAMPLES

The following paragraphs provide various examples of the embodiments disclosed herein.

Example 1 provides a microelectronic assembly (e.g., 100), comprising: a first integrated circuit (IC) die (e.g., 102(1)) in a first layer (e.g., 126(2)); an interposer (e.g., 104) in a second layer (e.g., 126(1)) not coplanar with the first layer, the first layer coupled to the second layer by interconnects (e.g., 120) having a pitch of less than 10 micrometers between adjacent interconnects; and a first conductive pathway (e.g., 110(1)) and a second conductive pathway (e.g., 110(2)) in the interposer coupling the first IC die and a second IC die (e.g., 102(2)), wherein: the first IC die is configured to transmit at a first supply voltage (e.g., VCC1) through the first conductive pathway to a second IC die, the second IC die is configured to transmit to the first IC die through the second conductive pathway at a second supply voltage (e.g., VCC2) simultaneously with the first die transmitting at the first supply voltage, and the first supply voltage is different from the second supply voltage.

Example 2 provides the microelectronic assembly of example 1, wherein: the first IC die is configured to transmit at a first supply voltage through the interposer to a plurality of other IC dies (e.g., 102(3), 102(4)), each of the plurality of other IC dies is configured to transmit at respective supply voltages (e.g., VCC3, VCC4) through the interposer to the first IC die simultaneously with the first die transmitting at the first supply voltage, and the respective supply voltages are each different from the first supply voltage.

Example 3 provides the microelectronic assembly of any one of examples 1-2, wherein: a first transmission circuit (e.g., 106(1)) in the first IC die is configured to transmit to a first receiver circuit (e.g., 108(2)) in the second IC die, and a second receiver circuit (e.g., 108(1)) in the first IC die is configured to receive from a second transmission circuit (e.g., 106(2)) in the second IC die.

Example 4 provides the microelectronic assembly of example 3, wherein: the first transmission circuit is configured to transmit at a first frequency, the second transmission circuit is configured to transmit at a second frequency, and the first frequency is different from the second frequency.

Example 5 provides the microelectronic assembly of any one of examples 3-4, wherein: transistors in the first transmission circuit have a first channel length, transistors in the second transmission circuit have a second channel length, and the first channel length is different from the second channel length.

Example 6 provides the microelectronic assembly of any one of examples 3-5, wherein: transistors in the first transmission circuit have a first oxide thickness, transistors in the second transmission circuit have a second oxide thickness, and the first oxide thickness is different from the second oxide thickness.

Example 7 provides the microelectronic assembly of any one of examples 3-6, wherein a first range of maximum operating frequencies and corresponding supply voltages of the first transmission circuit is different from a second range of maximum operating frequencies and corresponding supply voltages of the second transmission circuit.

Example 8 provides the microelectronic assembly of any one of examples 1-7, wherein (e.g., FIG. 1B, FIG. 4): the interposer comprises a third IC die (e.g., 115), and each of the first conductive pathway and the second conductive pathway is through a metallization stack (e.g., 114) in the first IC die, at least one of the interconnects, and another metallization stack (e.g., 118) in the third IC die.

Example 9 provides the microelectronic assembly of example 8, wherein the interposer further comprises a dielectric material (e.g., 122) surrounding the third IC die with through-dielectric vias (TDVs) (e.g., 124) in the dielectric material.

Example 10 provides the microelectronic assembly of any one of examples 1-8, further comprising the second IC die (e.g., 102(2), FIG. 1B), wherein: the second IC die is in the first layer, and each of the first conductive pathway and the second conductive pathway is through a first metallization stack in the first IC die, at least one of the interconnects between the first IC die and the interposer, a second metallization stack in the second IC die, at least one of the interconnects between the second IC die and the interposer, and a third metallization stack in the interposer.

Example 11 provides the microelectronic assembly of example 10 (e.g., FIG. 1B), further comprising a package substrate (e.g., 128) coupled to the second layer.

Example 12 provides the microelectronic assembly of example 10 (e.g., FIG. 4), further comprising a package substrate coupled to the first layer.

Example 13 provides the microelectronic assembly of any one of examples 1-7, wherein the interposer comprises the second IC die (e.g., FIG. 5B).

Example 14 provides the microelectronic assembly of example 13, wherein each of the first conductive pathway and the second conductive pathway is through a first metallization stack in the first IC die, at least one of the interconnects between the first IC die and the second IC die, and a second metallization stack in the second IC die.

Example 15 provides the microelectronic assembly of example 14, wherein each of the first conductive pathway and the second conductive pathway is further through a through-substrate via (TSV) (e.g., 602) in the second IC die.

Example 16 provides an interposer (e.g., 104), comprising: a first IC die having a first conductive pathway and a second conductive pathway; a first set of interconnects on a first side, a portion of the first set to couple to a second IC die; and a second set of interconnects on a second side opposite to the first side, wherein: the first IC die is not coplanar with the second IC die, the first set of interconnects has a first pitch less than 10 micrometers between adjacent interconnects, the second set of interconnects has a second pitch greater than 10 micrometers between adjacent ones of the interconnects, the first conductive pathway is to couple between a first transmission circuit and a first receiver circuit and operate at a first voltage, the second conductive pathway is to couple between a second transmission circuit and a second receiver circuit and operate at a second voltage different from the first voltage.

Example 17 provides the interposer of example 16, wherein the first IC die further comprises a plurality of other conductive pathways, each other conductive pathway coupling a respective pair comprising a transmission circuit and a receiver circuit, the other conductive pathways configured to operate at different voltages.

Example 18 provides the interposer of example 17, wherein the transmission circuit in the respective pair is in an IC die different from another IC die in which is the receiver circuit in the respective pair.

Example 19 provides the interposer of any one of examples 16-18, further comprising (e.g., FIG. 1B): a dielectric material surrounding the first IC die; and TDVs in the dielectric material.

Example 20 provides the interposer of any one of examples 16-19, wherein (e.g., FIG. 6): the first IC die further comprises TSVs, and each of the first conductive pathway and the second conductive pathway is through the TSVs.

Example 21 provides the interposer of example 16, wherein (e.g., FIGS. 5A-5B): the first transmission circuit and the second receiver circuit are in the first IC die, and the first receiver circuit and the second transmission circuit are in the second IC die.

Example 22 provides the interposer of any one of examples 16-18, wherein (e.g., FIG. 1B): another portion of the first set of interconnects is to couple to a third IC die, the third IC die is not coplanar with the first IC die, the first transmission circuit and the second receiver circuit are in the second IC die, and the first receiver circuit and the second transmission circuit are in the third IC die.

Example 23 provides the interposer of example 16, further comprising a third IC die coplanar with the first IC die, wherein (e.g., FIG. 4): the first transmission circuit and the second receiver circuit are in the first IC die, the first receiver circuit and the second transmission circuit are in the third IC die, and each of the first conductive pathway and the second conductive pathway is through the second IC die.

Example 24 provides the interposer of example 16, wherein the second set of interconnects is to couple to a package substrate (e.g., 128).

Example 25 provides the interposer of any one of examples 16-24, wherein the first voltage is a first supply voltage of the first transmission circuit, and the second voltage is a second supply voltage of the second transmission circuit.

Example 26 provides a method for dynamic voltage and frequency scaling (DVFS) in an IC package, the method comprising: providing a first transmission circuit and a first receiver circuit in a first IC die; providing a second transmission circuit and a second receiver circuit in a second IC die; transmitting a first data signal at a first voltage and a first frequency from the first transmission circuit to the second receiver circuit; and transmitting a second data signal at a second voltage and a second frequency from the second transmission circuit to the first receiver circuit simultaneously as transmitting the first data signal at the first voltage and the first frequency from the first transmission circuit to the second receiver circuit, wherein: the first voltage is different from the second voltage, the first frequency is a maximum operating frequency of the first transmission circuit at the first voltage, and the second frequency is a maximum operating frequency of the second transmission circuit at the second voltage.

Example 27 provides the method of example 26, further comprising scaling the first voltage in a range between a minimum voltage and a maximum voltage without changing the second voltage.

Example 28 provides the method of any one of examples 26-27, further comprising: transmitting a first clock signal from the first transmission circuit to the second receiver circuit; and transmitting a second clock signal from the second transmission circuit to the first receiver circuit, wherein the first clock signal is different from the second clock signal.

Example 29 provides the method of any one of examples 26-28, wherein: the first receiver circuit and the second receiver circuit comprise respective level shifters, the level shifter in the first receiver circuit shifts voltage from the second voltage to the first voltage, and the level shifter in the second receiver circuit shifts voltage from the first voltage to the second voltage.

Example 30 provides the method of any one of examples 26-29, further comprising: providing a plurality of transmission circuits in separate IC dies in the IC package; providing a plurality of receiver circuits in the separate IC dies, each one in the plurality of transmission circuits in any one IC die coupled to a corresponding one in the plurality of receiver circuits in any other IC die; and transmitting data signals from the plurality of transmission circuits to corresponding receiver circuits simultaneously, each such transmitting being at a different voltage and a different frequency.

Example 31 provides the method of example 26, wherein: the first IC die is in a first layer of the IC package, the second IC die is in a second layer of the IC package, and the first layer is not coplanar with the second layer.

Example 32 provides the method of example 26, wherein: the first IC die and the second IC die are in a first layer of the IC package, the transmitting is through a conductive pathway in a third IC die, the third IC die is in a second layer of the IC package, and the first layer is not coplanar with the second layer.

Example 33 provides the method of example 32, wherein a package substrate is coupled to the first layer.

Example 34 provides the method of example 32, wherein a package substrate is coupled to the second layer.

Example 35 provides the method of any one of examples 26-34, further comprising repeater circuits in conductive pathways between the first IC die and the second IC die.

The above description of illustrated implementations of the disclosure, including what is described in the abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. A microelectronic assembly, comprising:
a first integrated circuit (IC) die in a first layer;
an interposer in a second layer not coplanar with the first layer, the first layer coupled to the second layer by interconnects having a pitch of less than 10 micrometers between adjacent interconnects; and
a first conductive pathway and a second conductive pathway in the interposer coupling the first IC die and a second IC die,
wherein:
the first IC die comprises first circuitry to transmit a first data signal at a first supply voltage through the first conductive pathway to the second IC die,
the second IC die comprises second circuitry to transmit a second data signal to the first IC die through the second conductive pathway at a second supply voltage simultaneously with transmission of the first data signal at the first supply voltage by the first IC die, and the first supply voltage is different from the second supply voltage.

2. The microelectronic assembly of claim 1, wherein:
the first circuitry is to transmit at the first supply voltage through the interposer to a third IC die,
the third IC die comprises third circuitry to transmit at a third supply voltage through the interposer to the first IC die simultaneously with the first IC die transmitting at the first supply voltage, and
the third supply voltage is different from the first supply voltage.

3. The microelectronic assembly of claim 1, wherein:
a first transmission circuit in the first IC die is configured to transmit the first data signal to a first receiver circuit in the second IC die at the first supply voltage, and
a second receiver circuit in the first IC die is configured to receive the second data signal from a second transmission circuit in the second IC die at the second supply voltage.

4. The microelectronic assembly of claim 3, wherein:
the first transmission circuit is configured to transmit at a first frequency,
the second transmission circuit is configured to transmit at a second frequency, and
the first frequency is different from the second frequency.

5. The microelectronic assembly of claim 3, wherein a first range of maximum operating frequencies and corresponding supply voltages of the first transmission circuit is different from a second range of maximum operating frequencies and the corresponding supply voltages of the second transmission circuit.

6. The microelectronic assembly of claim 1, wherein:
the interposer comprises a third IC die, and
each of the first conductive pathway and the second conductive pathway is through a metallization stack in the first IC die, at least one of the interconnects, and another metallization stack in the third IC die.

7. The microelectronic assembly of claim 6, wherein the interposer further comprises a dielectric material surrounding the third IC die with through-dielectric vias (TDVs) in the dielectric material.

8. The microelectronic assembly of claim 1, further comprising the second IC die, wherein:
the second IC die is in the first layer, and
each of the first conductive pathway and the second conductive pathway is through a first metallization stack in the first IC die, at least one of the interconnects between the first IC die and the interposer, a second metallization stack in the second IC die, at least one of the interconnects between the second IC die and the interposer, and a third metallization stack in the interposer.

9. The microelectronic assembly of claim 8, further comprising a package substrate coupled to the second layer.

10. A microelectronic assembly, comprising:
a first integrated circuit (IC) die in a first layer;
an interposer in a second layer, the first layer coupled to the second layer by interconnects having a pitch of less than 10 micrometers between adjacent interconnects; and
a first conductive pathway and a second conductive pathway in the interposer coupling the first IC die and a second IC die,
wherein:
the first IC die comprises first circuitry to transmit a first clock signal at a first supply voltage through the first conductive pathway to the second IC die,
the second IC die comprises second circuitry to transmit a second clock signal to the first IC die through the second conductive pathway at a second supply voltage simultaneously with transmission of the first clock signal at the first supply voltage by the first IC die, and
the first supply voltage is different from the second supply voltage.

11. The microelectronic assembly of claim 10, wherein:
the first circuitry is to transmit at the first supply voltage through the interposer to a third IC die,
the third IC die comprises third circuitry to transmit at a third supply voltage through the interposer to the first IC die simultaneously with the first IC die transmitting at the first supply voltage, and
the third supply voltage is different from the first supply voltage.

12. The microelectronic assembly of claim 10, wherein:
a first transmission circuit in the first IC die is configured to transmit the first clock signal to a first receiver circuit in the second IC die at the first supply voltage, and
a second receiver circuit in the first IC die is configured to receive the second clock signal from a second transmission circuit in the second IC die at the second supply voltage.

13. The microelectronic assembly of claim 12, wherein:
the first transmission circuit is configured to transmit at a first frequency,
the second transmission circuit is configured to transmit at a second frequency, and
the first frequency is different from the second frequency.

14. The microelectronic assembly of claim 12, wherein a first range of maximum operating frequencies and corresponding supply voltages of the first transmission circuit is different from a second range of maximum operating frequencies and the corresponding supply voltages of the second transmission circuit.

15. The microelectronic assembly of claim 10, wherein:
the interposer comprises a third IC die, and
each of the first conductive pathway and the second conductive pathway is through a metallization stack in the first IC die, at least one of the interconnects, and another metallization stack in the third IC die.

16. The microelectronic assembly of claim 15, wherein the interposer further comprises a dielectric material surrounding the third IC die with through-dielectric vias (TDVs) in the dielectric material.

17. A microelectronic assembly, comprising:
a first integrated circuit (IC) die in a first layer;
an IC structure in a second layer, the first layer coupled to the second layer by interconnects having a pitch of less than 10 micrometers between adjacent interconnects; and
a first conductive pathway and a second conductive pathway in the IC structure coupling the first IC die and a second IC die,
wherein:
the first IC die comprises first circuitry to transmit a first data signal at a first supply voltage and a first frequency through the first conductive pathway to the second IC die,
the second IC die comprises second circuitry to transmit a second data signal to the first IC die through the second conductive pathway at a second supply voltage and a second frequency simultaneously with transmission of the first data signal by the first IC die, and
the first supply voltage is different from the second supply voltage.

18. The microelectronic assembly of claim 17, wherein:
the first circuitry is to transmit at the first supply voltage through the IC structure to a third IC die,
the third IC die comprises third circuitry to transmit at a third supply voltage through the IC structure to the first IC die simultaneously with the first IC die transmitting the first data signal, and the third supply voltage is different from the first supply voltage.

19. The microelectronic assembly of claim 17, wherein:
the first frequency is different from the second frequency.

20. The microelectronic assembly of claim 17, wherein:
the first circuitry is to transmit at the first frequency through the IC structure to a third IC die,
the third IC die comprises third circuitry to transmit at a third frequency through the IC structure to the first IC die simultaneously with the first IC die transmitting at the first frequency, and
the third frequency is different from the first frequency.

* * * * *